United States Patent
Lee

(10) Patent No.: US 8,080,842 B2
(45) Date of Patent: Dec. 20, 2011

(54) NONVOLATILE MEMORY DEVICE

(75) Inventor: Chang-Hyun Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 1067 days.

(21) Appl. No.: 11/434,175

(22) Filed: May 16, 2006

(65) Prior Publication Data

US 2006/0261398 A1 Nov. 23, 2006

(30) Foreign Application Priority Data

May 18, 2005 (KR) .................. 10-2005-0041636

(51) Int. Cl.
*H01L 29/76* (2006.01)

(52) U.S. Cl. ... 257/314; 257/200; 257/240; 257/E21.68; 257/E21.689; 257/E21.691; 257/E27.016; 257/E27.081; 257/E21.087; 257/E27.04; 438/3; 438/257; 438/261; 438/264; 438/267

(58) Field of Classification Search .................. 257/200, 257/240, 314, E21.008, E21.009, E21.279, 257/E21.679, E21.66, E21.664, E21.68, E21.689, 257/E21.691, E27.016, E27.081, E27.087, 257/E27.104, 3, 257–267
See application file for complete search history.

(56) References Cited

U.S. PATENT DOCUMENTS

| | | | |
|---|---|---|---|
| 6,153,477 A * | 11/2000 | Gardner et al. ............... 438/286 |
| 7,399,672 B2 * | 7/2008 | Lee et al. ....................... 438/257 |
| 2002/0137287 A1 * | 9/2002 | Takebuchi ..................... 438/258 |
| 2003/0011017 A1 * | 1/2003 | Lee et al. ....................... 257/314 |
| 2003/0030097 A1 * | 2/2003 | Lee et al. ....................... 257/314 |
| 2003/0042532 A1 * | 3/2003 | Forbes ............................ 257/316 |
| 2003/0080387 A1 * | 5/2003 | Cho et al. ....................... 257/369 |
| 2004/0014323 A1 * | 1/2004 | Shimizu ......................... 438/694 |
| 2004/0212019 A1 * | 10/2004 | Shinohara et al. ............. 257/368 |
| 2005/0088889 A1 * | 4/2005 | Lee et al. ....................... 365/202 |
| 2005/0093047 A1 * | 5/2005 | Goda et al. .................... 257/300 |
| 2006/0261401 A1 * | 11/2006 | Bhattacharyya .............. 257/316 |

FOREIGN PATENT DOCUMENTS

| | | |
|---|---|---|
| JP | 2003-347511 | 12/2003 |
| JP | 2004-039866 | 2/2004 |
| KR | 10-0318148 | 4/2002 |

* cited by examiner

*Primary Examiner* — Meiya Li

(74) *Attorney, Agent, or Firm* — Harness, Dickey & Pierce, P.L.C.

(57) ABSTRACT

Disclosed is a nonvolatile memory device with cell and peripheral circuit regions confined on a substrate. Cell gate electrodes are arranged in the cell region while peripheral gate electrodes are arranged in the peripheral-circuit region. Each cell gate electrode includes stacked conductive and semiconductor layers, but the peripheral gate electrode includes stacked semiconductor layers. The conductive layer of the cell gate electrode is different from the lowest semiconductor layer of the peripheral gate electrode in material, which can improve characteristics of memory cells and peripheral transistors without causing mutual interference with each other.

21 Claims, 13 Drawing Sheets

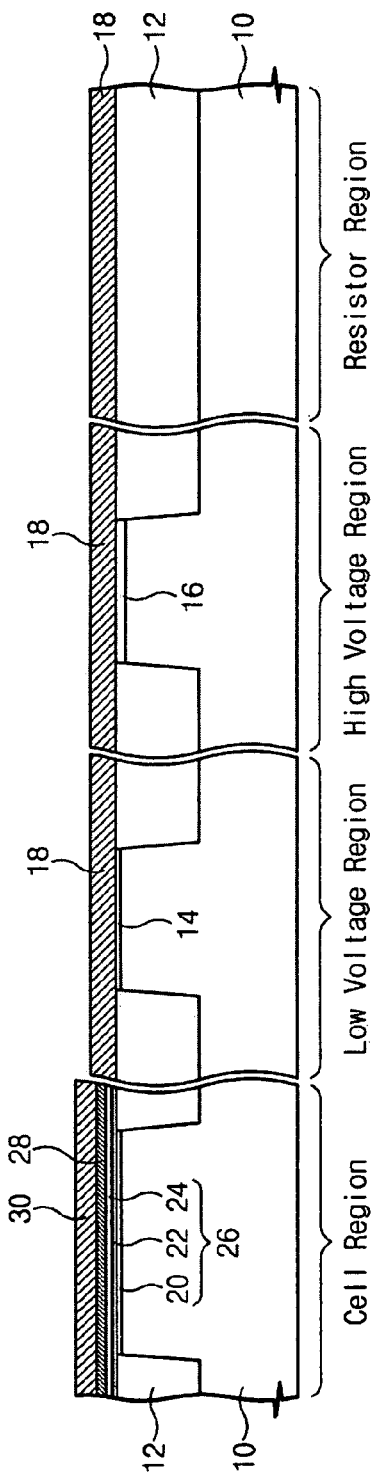
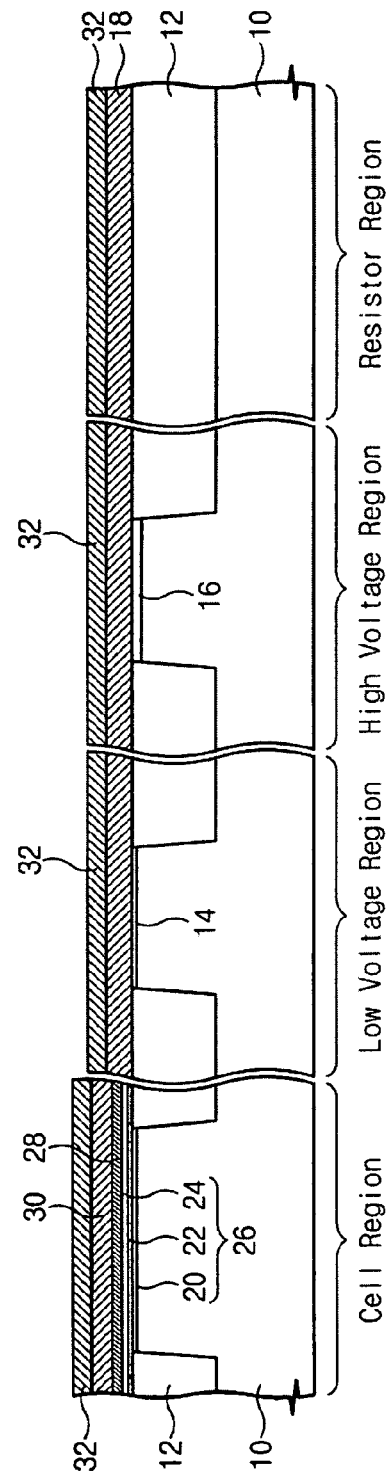

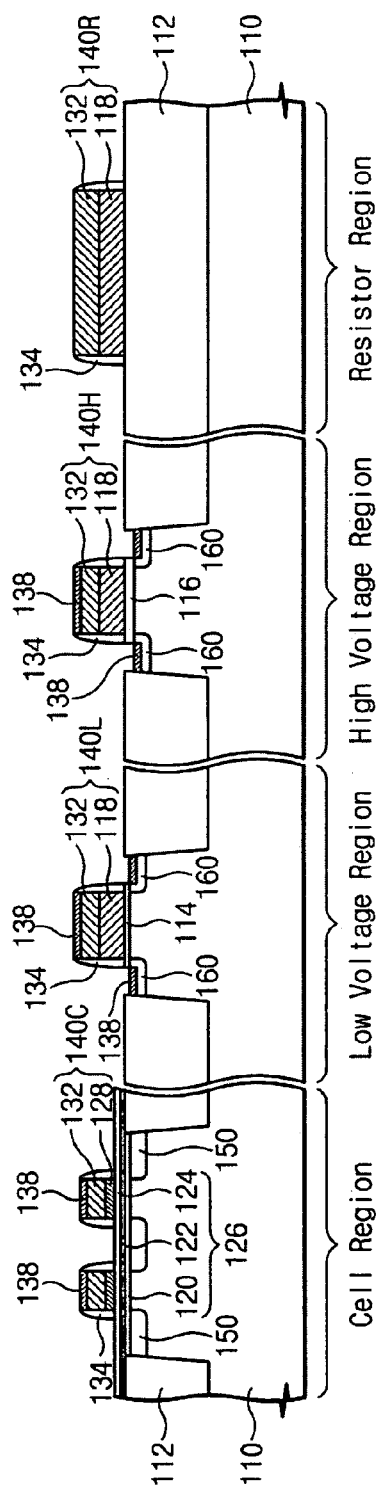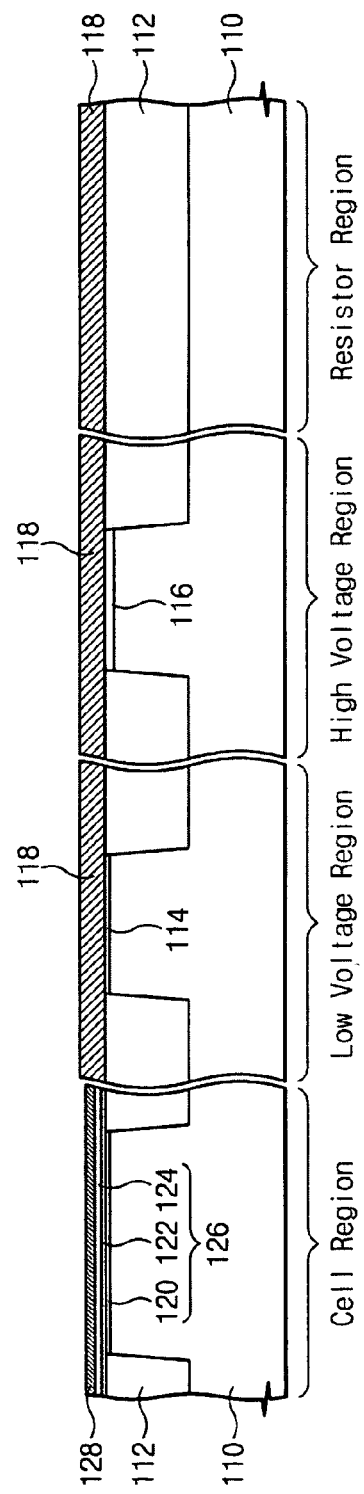

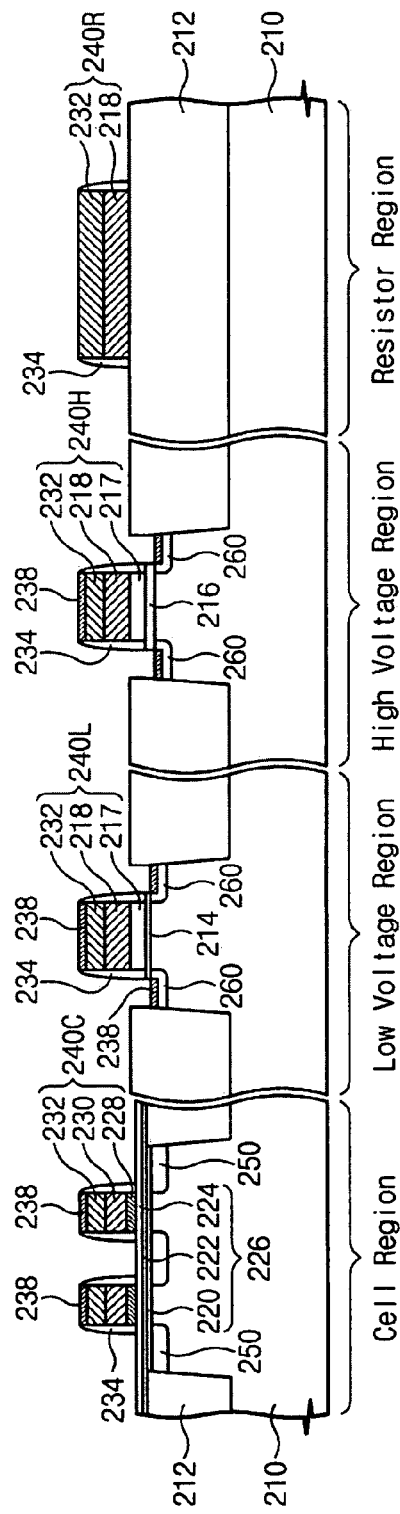
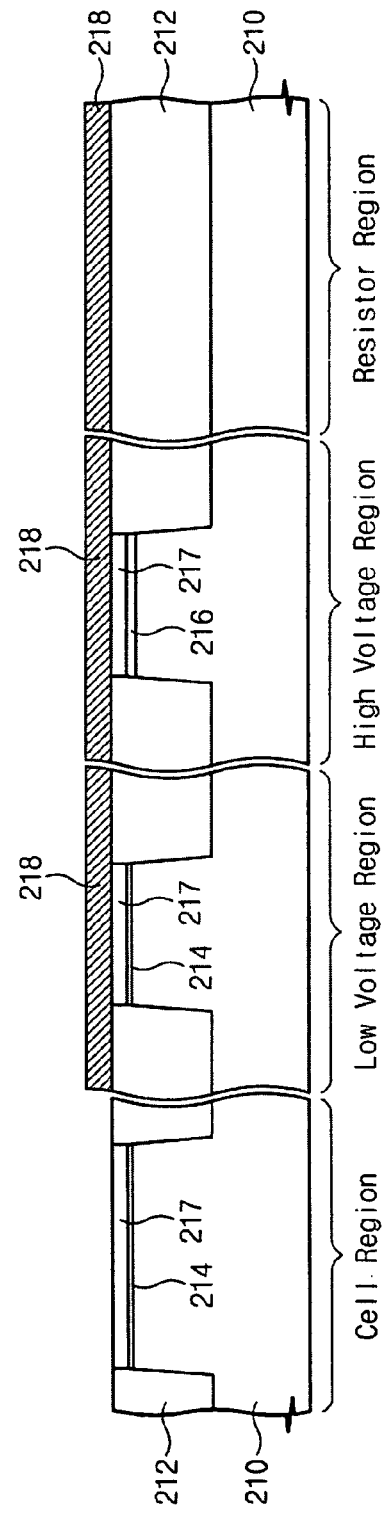

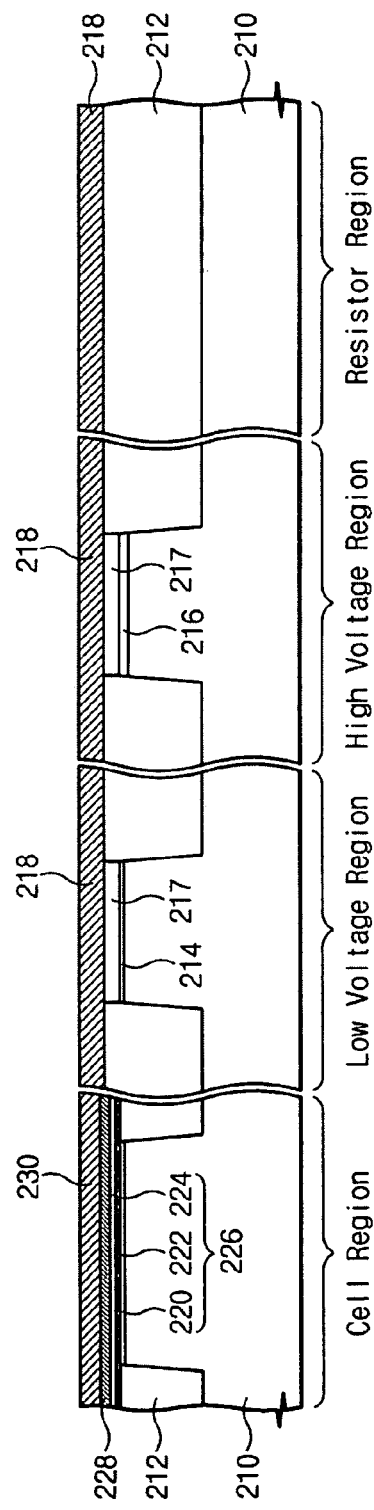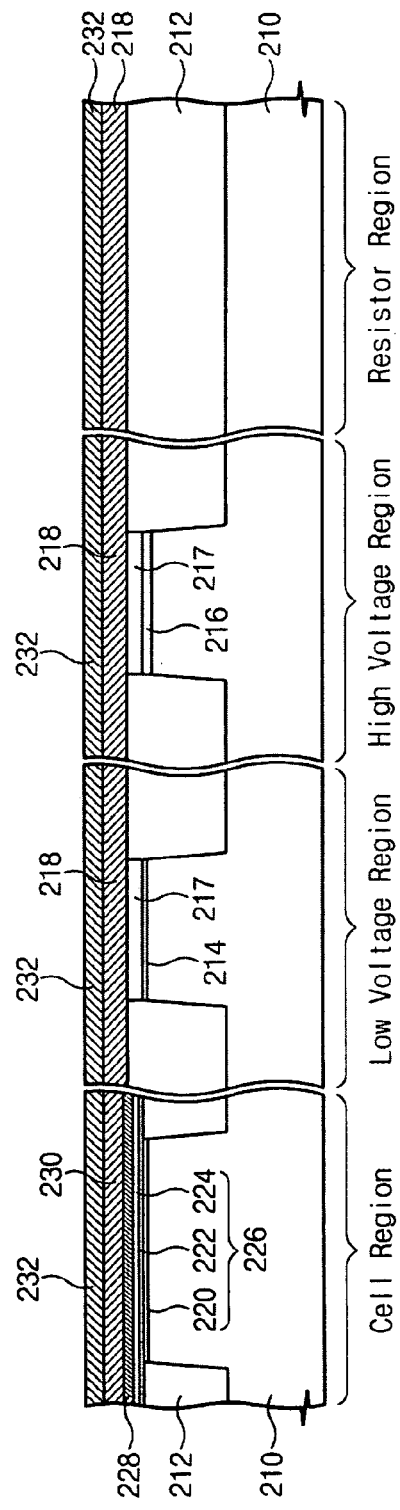

NONVOLATILE MEMORY DEVICE

PRIORITY STATEMENT

This U.S. non-provisional patent application claims priority under 35 U.S.C. §119 of Korean Patent Application 2005-41636 filed on May 18, 2005, the entire contents of which are hereby incorporated by reference.

BACKGROUND

The present invention relates to semiconductor devices. In particular, the present invention relates to nonvolatile memory devices.

Nonvolatile memory devices, electrically storing data and retaining the stored data until erasing signals are input, are required to be operable at low voltages for writing and erasing, and to have superior data retention. Generally, in cell regions of nonvolatile memory devices having multi-layer charge-storage layers, there are memory cells having multi-layer charge storage layers formed on substrates, and gate electrodes formed on the charge storage layers.

In the nonvolatile memory devices having the multi-layer insulation layers for charge storage, electrons or holes are discharged into the substrates from the charge-storage insulation layers, or injected into the charge-storage insulation layers from the substrates. Data states are read by evaluating variations of threshold voltages in accordance with potentials of the charge-storage insulation layers. In order to improve the efficiencies of writing/erasing data in the nonvolatile memory devices having the multi-layer insulation layers for charge storage, various methods have been studied. One such method involves changing materials of the charge-storage insulation layers.

Like a typical memory device, the nonvolatile memory device has a peripheral circuit region for operating the memory device in compliance with programmed information, as well as a cell region for containing data. In the peripheral circuit region, active elements such as transistors and passive elements such as resistors are arranged according to various structures. In order to drive the nonvolatile memory device by a low power-supply voltage, the transistors of the peripheral circuit region are required to be operated according to low threshold voltages and exhibit large saturation currents without increasing off-currents.

SUMMARY

At least one embodiment of the present invention is directed to a nonvolatile memory device with a structure capable of enhancing the performance of transistors in a peripheral circuit region and improving efficiencies and characteristics of memory cells.

In more detail, at least one embodiment of the present invention is directed to a nonvolatile memory device with a structure capable of enhancing the efficiencies of writing and erasing data and the retention of data, lowering threshold voltages but raising saturation currents without increasing off-currents.

At least one embodiment of the present invention is also directed to a nonvolatile memory device with a structure capable of improving characteristics of memory cells and peripheral transistors without affecting them to each other.

At least one embodiment of the present invention provides a nonvolatile memory device in which the lowest material of a cell gate electrode formed in a cell region is different from the lowest material of a gate electrode formed in a peripheral circuit region.

One or more embodiments of the present invention provide a nonvolatile memory device that includes a substrate having cell and peripheral circuit regions, cell gate electrodes formed in the cell region and a peripheral-circuit gate electrode formed in the peripheral circuit region. The cell gate electrode has a conductive layer and a semiconductor layer, while the peripheral-circuit gate electrode has semiconductor layers. The conductive layer of the cell gate electrode is different from the lowest semiconductor layer of the peripheral-circuit gate electrode in material.

By using the structure one or more of the presently disclosed embodiments of the present invention, it is possible to improve the performance of transistors by selectively doping the semiconductor layers of the peripheral-circuit gate electrode with N or P-type ionic impurities. Furthermore, according to one or more embodiments of the present invention, efficiencies and data retention characteristics of memory cells cam be improved by forming the conductive layer of the cell gate electrode with a material having a work function larger than, e.g., about 4 eV.

Additional features and advantages of the present invention will be more fully apparent from the following detailed description of example embodiments, the accompanying drawings and the associated claims.

BRIEF DESCRIPTION OF THE DRAWINGS

The accompanying drawings are included to provide a further understanding of the invention, and are incorporated in and constitute a part of this specification. The drawings illustrate example embodiments of the invention and, together with the description, serve to explain principles of the present invention. In the figures:

FIGS. 1B through 1D are cross-sectional views showing (in accordance with an example embodiment of the present invention) a method of forming the nonvolatile memory device shown in FIG. 1A;

FIG. 2A is a cross-sectional view of a nonvolatile memory device in accordance with an example embodiment of the present invention;

FIGS. 2B and 2C are cross-sectional views showing (in accordance with an example embodiment of the present invention) a method of forming the nonvolatile memory device shown in FIG. 2A;

FIG. 3A is a cross-sectional view of a nonvolatile memory device in accordance with an example embodiment of the present invention;

FIGS. 3B and 3D are cross-sectional views showing (in accordance with an example embodiment of the present invention) a method of forming the nonvolatile memory device shown in FIG. 3A;

DETAILED DESCRIPTION OF EXAMPLE EMBODIMENTS

Figure 1A:
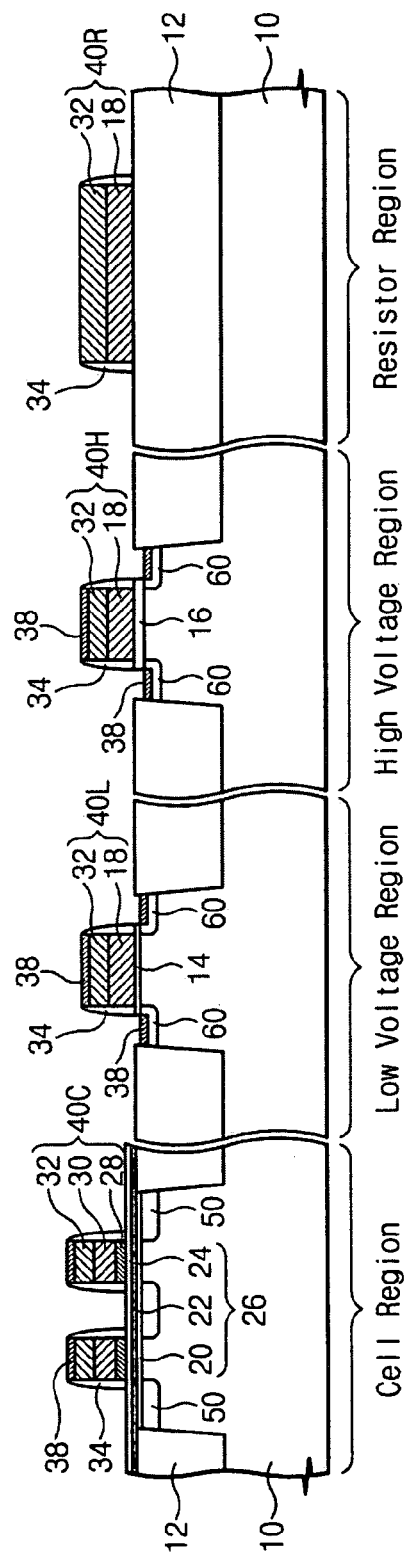
FIG. 1A is a cross-sectional view of a nonvolatile memory device in accordance with an example embodiment of the present invention.

It will be understood that if an element or layer is referred to as being "on," "against," "connected to" or "coupled to" another element or layer, then it can be directly on, against, connected or coupled to the other element or layer, or intervening elements or layers may be present. In contrast, if an element is referred to as being "directly on", "directly connected to" or "directly coupled to" another element or layer, then there are no intervening elements or layers present. Like numbers refer to like elements throughout. As used herein, the term "and/or" includes any and all combinations of one or more of the associated listed items.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, term such as "below" can encompass both an orientation of above and below. The device may be otherwise oriented (rotated 90 degrees or at other orientations) and the spatially relative descriptors used herein interpreted accordingly.

Although the terms first, second, etc. may be used herein to describe various elements, components, regions, layers and/or sections, it should be understood that these elements, components, regions, layers and/or sections should not be limited by these terms. These terms are used only to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing example embodiments only and is not intended to be limiting of the present invention. As used herein, the singular forms "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

In the drawings, the thickness of layers and regions are exaggerated for clarity.

Hereinafter, it will be described about example embodiments of the present invention in conjunction with the accompanying drawings, respectively.

FIG. 1A is a cross-sectional view of a nonvolatile memory device in accordance with an example embodiment of the present invention.

Referring to FIG. 1A, the nonvolatile memory device is comprised of a cell region, a high-voltage region, a low-voltage region, and a resistor region. The cell region includes a multi-layer charge-storage insulation layer 26 on which a cell gate electrode 40C is formed. Source and drain regions 50 are formed in a substrate 10 at both sides of the cell gate electrodes 40C. While the multi-layer charge-storage insulation layer 26 is depicted as extending over field isolation layers 12, alternatively it may be confined so as not to extend beyond the cell gate electrodes 40C.

The multi-layer charge-storage insulation layer 26 may be composed of a tunnel insulation layer 20, a charge-trapping insulation layer 22, and a blocking insulation layer 24 those are stacked in sequence. Here, the tunnel insulation layer 20 and the blocking insulation layer 24 may include at least a layer of insulation that is formed of Al2O3, hafnium aluminate (HfAlO), HfAlON, hafnium silicate (HfSiO), or HfSiON. The charge-storage insulation layer 26 may include at least a layer of insulation that is formed of hafnium aluminate, HfAlO, HfAlON, hafnium silicate, HfSiO, or HfSiON.

A way to enhance the efficiencies of writing and erasing data in the memory device is to make the minimum electric field of the tunnel insulation layer 20 stronger than the minimum electric field of the blocking insulation layer 24 when the electric fields are formed at the multi-layer charge-storage insulation layer 26. The following Equation 1 summarizes the relation between voltages and electric fields when a voltage is applied between the gate electrode 40C and the substrate 10.

$$V = E_{ot} \left( X_{ot_1} + \varepsilon_{ot_1} \sum \frac{X_{ot_1}}{\varepsilon_{ot_1}} + \varepsilon_{ot_1} \sum \frac{X_{k_m}}{\varepsilon_{k_m}} + \varepsilon_{ot_1} \sum \frac{X_{ob_n}}{\varepsilon_{ob_n}} \right)$$ [Equation 1]

The suffixes of the Equation 1, 'ot', 'k', and 'ob', represent the tunnel insulation layer 20, the charge-storage insulation layer 26, and the blocking insulation layer 24, respectively. And, the suffixes, 'l', 'm', and 'n', are provided for identifications to the tunnel insulation layer 20, the charge-storage insulation layer 26, and the blocking insulation layer 24, respectively. Here, 'l' denotes the number of tunnel insulation layers, being counted from 2, and 'm' and 'n' denote the numbers of charge-storage insulation layer and blocking insulation layer, being counted from 1. 'E' represents the electric field on the insulation layer and 'X' represents the thickness of the insulation layer. For example, the suffix 'ot1' denotes an insulation layer where the lowest electric field is generated in the tunnel insulation layer 20.

Assuming an electric field Eot formed at the insulation layer ot1, the electric fields manifested at the tunnel insulation layer 20, the charge-storage insulation layer 26, and the blocking insulation layer 24 are inversely proportional to their dielectric constants. As the dielectric constants of the blocking insulation layer and the charge-storage insulation layer become higher, the electric field Eot increases when the same voltage V is applied thereto. As a result, as the dielectric constants of the blocking insulation layer and the charge-storage insulation layer become higher, the voltages for writing and erasing data can be reduced and the electric field manifested at the tunnel insulation layer 20 is relatively stronger than that manifested at the blocking insulation layer 24.

The cell gate electrode 40C includes a conductive layer 28, and second and third semiconductor layers 30 and 32 successively stacked. To improve conductivity for the cell gate electrode 40C, a cell-gate silicide layer 38 can be formed on the third semiconductor layer 32.

The conductive layer 28 may be composed of a single layer or multiple layers of metal having a work function larger than about 4 eV in order to elevate the potential barrier between the cell gate electrode 40C and the multi-layer charge-storage insulation layer 26. The conductive layer 28 may further include a polysilicon layer formed on the one or more layers whose work function is larger than about 4 eV. If the potential barrier between the blocking insulation layer 24 and the conductive layer 28 can be increased, then it is as if charges moving toward the blocking insulation layer 24 from the cell gate electrode 40C are confronted with a high barrier thereby reducing the probability of charges tunneling from the gate electrode to the charge-trapping insulation layer 22.

Metals having a work function larger than about 4 eV include tantalum nitride (TaN), tantalum (Ta), ruthenium (Ru), tungsten silicide (WSi), tungsten (W), tungsten nitride (WN), titanium (Ti), titanium nitride (TiN), tantalum-titanium (TaTi), tantalum-platinum (TaPt), tantalum silicon nitride (TaSiN), tantalum titanium nitride (TaTiN), hafnium nitride (HfN), titanium aluminum nitride (Ti2AlN), molybdenum (Mo) and platinum (Pt). The conductive layer 28 may be formed of a single layer of such a metal, or a metal alloy or stacked layer with two more materials.

Transistors arranged in the peripheral circuit region may be classified into high-voltage transistors adaptable to high-voltage operations and low-voltage transistors adaptable to low-voltage operations. It is known to fabricate low-voltage transistors and high-voltage transistors differently in terms if thickness of gate insulation layer, structure of source and drain regions, and so on, for the purpose of providing adaptive characteristics suitable for their functions.

A low-voltage gate-insulation layer 14 and a high-voltage gate-insulation layer 16 are formed respectively in the low and high-voltage regions. A low-voltage gate electrode 40L and a high-voltage gate electrode 40H are disposed on the low-voltage gate-insulation layer 14 and the high-voltage gate-insulation layer 16, respectively. Each of the low and high-voltage gate electrodes 40L and 40H includes the first and third semiconductor layers 18 and 32. The lowest semiconductor layers (e.g., 118) of the low and high-voltage gate electrodes 40L and 40H may be made of polysilicon. A peripheral-circuit gate-silicide layer 38 may be formed on the third semiconductor layer 32. Source/drain regions 60 are formed in the substrate 10 at both sides of the low and high-voltage gate electrodes 40L and 40H. The silicide layer 38 also may be formed in the source/drain regions 60.

In FIG. 1A, the suicide layers of the peripheral-circuit gate electrodes and the source/drain regions may be formed by the same processing step and made of a metal silicide containing the same metal. The silicide layer 38 on the cell gate electrode 40C of the cell region may include a metal different from the silicide layers on the gate electrodes 40L and 40H of the peripheral circuit region and the source/drain regions 60. Sidewall spacers 34 are formed on sidewalls of the gate electrodes (i.e., the low and high-voltage gate electrodes 40L and 40H) in the peripheral circuit region, as well as in the cell region. The silicide layers in the source/drain regions 60 are aligned according to the sidewall spacers 34.

The memory device of FIG. 1A further includes the resistor region where patterns of resistors are arranged. The resistor region is optionally provided for a circuit field where resistors are arranged, which may be a part of the peripheral circuit region. A plurality of resistor patterns 40R can be in the resistor region. The resistor patterns 40R can be electrically isolated from the semiconductor substrate 10 so as to provide their inherent resistance. Thus, the resistor patterns 40R may be disposed over the field isolation layers that are formed in the semiconductor substrate 10. The resistor pattern 40R may be formed of a stacked structure that includes the first and third semiconductor layers 18 and 32. In order to offer large resistance per unit area, there is no silicide layer on the third semiconductor layer 32 of the resistor pattern 40R. The lowest layer of the resistor pattern 40L may be made of polysilicon.

In the nonvolatile memory device according to FIG. 1A, materials forming the lowest layers of the gate electrodes are different respectively in the cell and peripheral circuit regions. Therefore, it is available to select gate materials for assuring the characteristics of the memory cells and peripheral circuit transistors. For example, the lowest layers of the cell gate electrodes are formed of metals while the lowest layers of the peripheral-circuit gate electrodes are formed of polysilicon. And, the performance of the memory device can be improved by selecting a metal having an appropriate work function and selecting conductivity of polysilicon.

The low and high-voltage gate electrodes, 40L and 40H, may be gate electrodes of PMOS or NMOS transistors. A dual-polysilicon gate may be used, by which the gate electrodes of the NMOS transistors are doped with N-type impurities while the gate electrodes of the PMOS transistors are doped with P-type impurities. And, the gate electrodes of the transistors and the resistor patterns may be different in doping concentration.

Figure 1B:
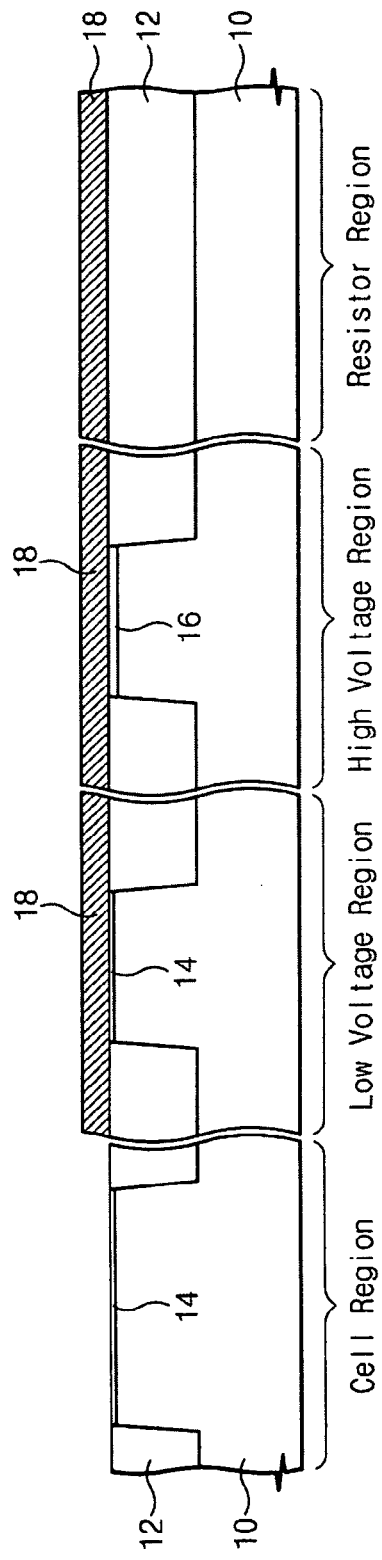

FIGS. 1B through 1D are cross-sectional views showing a method of forming the nonvolatile memory device shown in FIG. 1A.

Referring to FIG. 1B, it defines the cell region, the low-voltage region, the high-voltage region, and the resistor region in the semiconductor substrate 10. Each region is able to be confined in an optional field of the substrate 10 in accordance with the feature of circuit design for the memory device. The field isolation layers 12 are formed to confine a plurality of active regions in the semiconductor substrate 10.

The low-voltage gate-insulation layer 14 is formed in the low-voltage region and the cell region while the high-voltage gate-insulation layer 16 is formed in the high-voltage region. During this, the low-voltage or high-voltage gate-insulation layer, 14 or 16, may be formed in the cell region. The low-voltage gate-insulation layer 14 is thinner than the high-voltage gate-insulation layer 16. The high-voltage gate-insulation layer 16 is formed to be thicker than the low-voltage gate insulation layer 14 through the processing steps of first depositing an inchoate layer thereof before forming the field isolation layers and then increasing the thickness relative to the size of the inchoate layer while forming the low-voltage gate-insulation layer 14 after completing the field isolation layers 12. Otherwise, a first insulation layer is deposited all over the substrate after completing the field isolation layers 12. And then, the first insulation layer is partially removed from positions that correspond to the low-voltage gate-insulation layers 14 and a secondary insulation layer is deposited thereon to make the high-voltage gate-insulation layer 16 thicker than the low-voltage gate-insulation layer 14.

Thereafter, the first semiconductor layer 18 is deposited on the overall structure of the substrate including the low and high-voltage gate-insulation layers 14 and 16, and then partially removed from the cell region. The first semiconductor layer 18 may be made of polysilicon. During this, the first semiconductor layer 18 is formed, being either undoped or doped by ion implantation during or after deposition of the polysilicon. Further, the first semiconductor layer 18 may be formed also to make the NMOS and PMOS transistors doped with impurities different from each other in conductivity.

Referring to FIG. 1C, the low-voltage gate-insulation layer 14 is selectively removed from the cell region to expose the surface of the substrate 10 on the active regions. On the substrate 10, the multi-layer charge-storage insulation layer 26 is formed by depositing the tunnel insulation layer 20, the charge-trapping layer 22, and the blocking insulation layer 24 in sequence. The conductive layer 28 and the second semiconductor layer 30 are deposited on the multi-layer charge-storage insulation layer 26.

The conductive layer 28 may be composed of a single layer or multiple layers of metal having a work function larger than about 4 eV. For example, the conductive layer 28 may be formed of a metal such as tantalum nitride (TaN), tantalum (Ta), ruthenium (Ru), tungsten silicide (WSi), tungsten (W), tungsten nitride (WN), titanium (Ti), titanium nitride (TiN), tantalum-titanium (TaTi), tantalum-platinum (TaPt), tantalum silicon nitride (TaSiN), tantalum titanium nitride (TaTiN), hafnium nitride (HfN), titanium aluminum nitride (Ti2AlN), molybdenum (Mo), or platinum (Pt), or otherwise formed of a metal alloy or stacked layer with two more materials. The conductive layer 28 may include a polysilicon layer formed on the one or more layers whose work function is larger than about 4 eV.

Removing the second semiconductor layer 30 and the conductive layer 28 from the peripheral circuit region (although not from the cell region), the first semiconductor layer 18 is disclosed thereby. The tunnel insulation layer 22 may be restrictively formed on the cell region, e.g., by way of a thermal oxidation process. As a result, the cell region is comprised of a stacked structure with the multi-layer charge-storage insulation layer 26, the conductive layer 28, and the second semiconductor layer 30, while the peripheral circuit region is comprised of the first semiconductor layer 18.

Next, referring to FIG. 1D, the third semiconductor layer 32 is deposited on the overall structure of the substrate. The third semiconductor layer 32, the second semiconductor layer 30, the first semiconductor layer 18, and the conductive layer 28 are patterned in sequence to form the cell gate electrodes 40C, the low-voltage gate electrode 40L, the high-voltage gate electrode 40H, and the resistor pattern 40R shown in FIG. 1A. The silicide layers 38 disposed on the cell gate electrodes 40C, the low-voltage gate electrode 40L, and the high-voltage gate electrode 40H may be completed through the processing steps of depositing a layer of silicide on the third semiconductor layer 32 and then removing the layer of silicide from the resistor region, or completed along with conducting a silicidation process for the source/drain regions 60 after patterning the gate electrodes 40C, 40L, and 40H.

FIG. 2A is a cross-sectional view of a nonvolatile memory device in accordance with an example embodiment of the present invention.

Referring to FIG. 2A, the nonvolatile memory device is comprised of a cell region, a high-voltage region, a low-voltage region, and a resistor region. The cell region includes a multi-layer charge-storage insulation layer 126 on which a cell gate electrode 140C is formed. Source and drain regions 150 are formed in a semiconductor substrate 110 at both sides of the cell gate electrodes 140C. While the multi-layer charge-storage insulation layer 126 is depicted as extending over field isolation layers, it may be confined so as not to extend beyond the cell gate electrodes 140C.

The multi-layer charge-storage insulation layer 126 may be composed of a tunnel insulation layer 120, a charge-trapping insulation layer 122, and a blocking insulation layer 124 those are stacked in sequence. Here, the tunnel insulation layer 120 and the blocking insulation layer 124 may include at least a layer of insulation that is formed of Al2O3, hafnium aluminate (HfAlO), HfAlON, hafnium silicate (HfSiO), or HfSiON. The charge-storage insulation layer 126 may include at least a layer of insulation that is formed of hafnium aluminate, HfAiO, HfAlON, hafnium silicate, HfSiO, or HfSiON.

Also in FIG. 2A, the blocking insulation layer 124 may include at least a layer of insulation having dielectric constant larger than that of the highest-dielectric layer of the tunnel insulation layer 120. The highest-dielectric layer of the blocking insulation layer 124 may be thicker than the highest-dielectric layer of the tunnel insulation layer 120.

The cell gate electrode 140C includes a conductive layer 128, and a third semiconductor layer 132 those are stacked, in order, on the multi-layer charge-storage insulation layer 126. To improve conductivity for the cell gate electrode 140C, a cell-gate silicide layer 138 can be formed on the third semiconductor layer 132.

The conductive layer 128 may be composed of a single layer or multiple layers of metal having a work function larger than about 4 eV in order to elevate the potential barrier between the cell gate electrode 140C and the multi-layer charge-storage insulation layer 126. If the potential barrier between the blocking insulation layer 124 and the conductive layer 128 can be increased, then it is as if charges moving toward the blocking insulation layer 124 from the cell gate electrode 140C are confronted with a high barrier thereby reducing the probability of charges tunneling from the gate electrode to the charge-trapping insulation layer 122.

Metals having a work function larger than about 4 eV include tantalum nitride (TaN), tantalum (Ta), ruthenium (Ru), tungsten silicide (WSi), tungsten (W), tungsten nitride (WN), titanium (Ti), titanium nitride (TiN), tantalum-titanium (TaTi), tantalum-platinum (TaPt), tantalum silicon nitride (TaSiN), tantalum titanium nitride (TaTiN), hafnium nitride (HfN), titanium aluminum nitride (Ti2AlN), molybdenum (Mo) and platinum (Pt). The conductive layer 128 may be formed of a single layer of such a metal, or a metal alloy or stacked layer with two more materials. Otherwise, the conductive layer 128 may further include a polysilicon layer formed on the one or more layers whose work function is larger than about 4 eV.

A low-voltage gate-insulation layer 114 and a high-voltage gate-insulation layer 116 are formed respectively in the low and high-voltage regions. A low-voltage gate electrode 140L and a high-voltage gate electrode 140H are disposed on the low-voltage gate-insulation layer 114 and the high-voltage gate-insulation layer 116, respectively. Each of the low and high-voltage gate electrodes 140L and 140H includes the first and third semiconductor layers 118 and 132. A peripheral-circuit gate-silicide layer 138 may be formed on the third semiconductor layer 132. Source/drain regions 160 are formed in the substrate 110 at both sides of the low and high-voltage gate electrodes 140L and 140H. The silicide layer 138 also may be formed in the source/drain regions 160.

In FIG. 2A, the silicide layers of the peripheral-circuit gate electrodes and the source/drain regions may be formed by the same processing step and made of a metal silicide containing the same metal. The silicide layer 138 on the cell gate electrode 140C may include a metal different from the silicide layers on the gate electrodes 140L and 140H of the peripheral circuit region and the source/drain regions 160. Sidewall spacers 134 are formed on sidewalls of the gate electrodes (i.e., the low and high-voltage gate electrodes 140L and 140H) in the peripheral circuit region, as well as in the cell region. The silicide layers in the source/drain regions 160 are aligned according to the sidewall spacers 134.

The memory device of FIG. 2A further includes the resistor region where patterns of resistors are arranged. The resistor region is optionally provided for a circuit field where resistors are arranged, which may be a part of the peripheral circuit region. A plurality of resistor patterns 140R are formed in the resistor region. The resistor patterns 40R can be electrically isolated from the semiconductor substrate 110 so as to provide their inherent resistance. Thus, the resistor patterns 140R may be disposed over the field isolation layers that are formed in the semiconductor substrate 110. The resistor pattern 140R may be formed of a stacked structure that includes the first and third semiconductor layers 118 and 132. In order to offer large resistance per unit area, there is no silicide layer on the third semiconductor layer 132 of the resistor pattern 140R.

The low and high-voltage gate electrodes, 140L and 140H, may be gate electrodes of PMOS or NMOS transistors. A dual-polysilicon gate may be used, by which the gate electrodes of the NMOS transistors are doped with N-type impurities while the gate electrodes of the PMOS transistors are doped with P-type impurities. And, the gate electrodes of the transistors and the resistor patterns may be different in doping concentration.

Figure 2C:
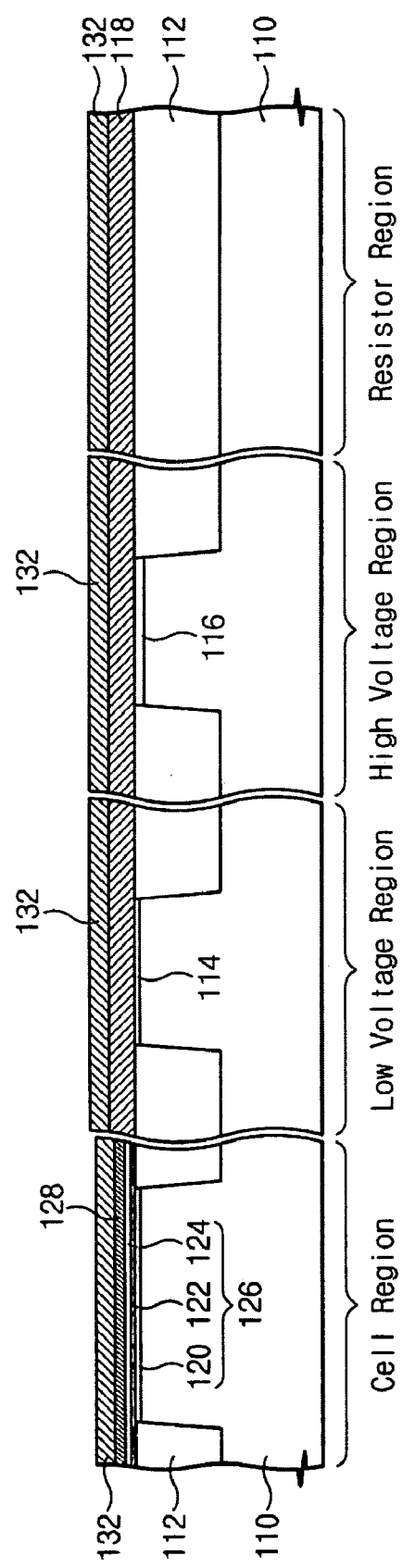

FIGS. 2B and 2C are cross-sectional views showing (in accordance with an example embodiment of the present invention) a method of forming the nonvolatile memory device shown in FIG. 2A.

Referring to FIG. 2B, it can be the same as in FIGS. 1B-1C regarding the processing steps of forming the field isolation layers 112 in the substrate 110, the low-voltage gate-insulation layer 114, the high-voltage gate-insulation layer 116, and the first semiconductor layer 118. Subsequently, the low-voltage gate-insulation layer 114 is selectively removed from the cell region to expose the surface of the substrate 110 on the active regions. On the substrate 110, the multi-layer charge-storage insulation layer 126 is formed by depositing the tunnel insulation layer 120, the charge-trapping layer 122, and the blocking insulation layer 124 in sequence.

The conductive layer 128 is deposited on the multi-layer charge-storage insulation layer 126. The conductive layer 128 may be composed of a single layer or multiple layers of metal having a work function larger than about 4 eV. For example, the conductive layer 128 may be formed of a metal such as tantalum nitride (TaN), tantalum (Ta), ruthenium (Ru), tungsten silicide (WSi), tungsten (W), tungsten nitride (WN), titanium (Ti), titanium nitride (TiN), tantalum-titanium (TaTi), tantalum-platinum (TaPt), tantalum silicon nitride (TaSiN), tantalum titanium nitride (TaTiN), hafnium nitride (HfN), titanium aluminum nitride (Ti2AlN), molybdenum (Mo), or platinum (Pt), or otherwise formed of a metal alloy or stacked layer with two more materials. The conductive layer 128 may include a polysilicon layer formed on the one or more layers whose work function is larger than about 4 eV.

Removing the conductive layer 128 from the peripheral circuit region (although not from the cell region), the first semiconductor layer 118 is exposed thereby. The tunnel insulation layer 122 may be restrictively formed on the cell region, e.g., by way of a thermal oxidation process. As a result, the cell region is comprised of a stacked structure with the multi-layer charge-storage insulation layer 126 and the conductive layer 128, while the peripheral circuit region is comprised of the first semiconductor layer 118.

Next, referring to FIG. 2C, the second semiconductor layer 132 is deposited on the overall structure of the substrate. The second semiconductor layer 132, the first semiconductor layer 118, and the conductive layer 128 are patterned in sequence to form the cell gate electrodes 140C, the low-voltage gate electrode 140L, the high-voltage gate electrode 140H, and the resistor pattern 140R shown in FIG. 2A. The silicide layers 138 disposed on the cell gate electrodes 140C, the low-voltage gate electrode 140L, and the high-voltage gate electrode 140H may be completed through the processing steps of depositing a layer of silicide on the second semiconductor layer 132 and then removing the layer of silicide from the resistor region, or completed along with conducting a silicidation process for the source/drain regions 160 after patterning the gate electrodes.

FIG. 3A is a cross-sectional view of a nonvolatile memory device in accordance with an example embodiment of the present invention.

The nonvolatile memory of FIG. 3A is similar to that according to FIG. 1A, but different in the feature that additional semiconductor layers 217 are formed, having sidewalls aligned to field isolation layers 212, under the bottoms of low and high-voltage gate electrodes 240L and 240H. In detail, the nonvolatile memory device is comprised of a cell region, a high-voltage region, a low-voltage region, and a resistor region. The cell region includes a multi-layer charge-storage insulation layer 226 on which a cell gate electrode 240C is formed. Source and drain regions 250 are formed in a substrate 210 at both sides of the cell gate electrodes 240C. While the multi-layer charge-storage insulation layer 226 is depicted as extending over field isolation layers 212, it may be confined so as not to extend beyond the cell gate electrodes 240C.

The multi-layer charge-storage insulation layer 226 may be composed of a tunnel insulation layer 220, a charge-trapping insulation layer 222, and a blocking insulation layer 224 those are stacked in sequence. Here, the tunnel insulation layer 220 and the blocking insulation layer 224 may include at least a layer of insulation that is formed of Al2O3, hafnium aluminate (HfAlO), HfAlON, hafnium silicate (HfSiO), or HfSiON. The charge-storage insulation layer 226 may include at least a layer of insulation that is formed of hafnium aluminate, HfAlO, HfAlON, hafnium silicate, HfSiO, or HfSiON.

Also in FIG. 3A, the blocking insulation layer 224 may include at least a layer of insulation having dielectric constant larger than that of the highest-dielectric layer of the tunnel insulation layer 220. The highest-dielectric layer of the blocking insulation layer 224 may be thicker than the highest-dielectric layer of the tunnel insulation layer 220.

The cell gate electrode 240C includes a conductive layer 228, and third and fourth semiconductor layers 230 and 232 successively stacked. To improve conductivity for the cell gate electrode 240C, a cell-gate silicide layer 238 can be formed on the fourth semiconductor layer 232.

The conductive layer 228 may be composed of a single layer or multiple layers of metal having a work function larger than about 4 eV in order to elevate the potential barrier between the cell gate electrode 240C and the multi-layer charge-storage insulation layer 226. The conductive layer 228 may further include a polysilicon layer formed on the one or more layers whose work function is larger than about 4 eV. If the potential barrier between the blocking insulation layer 224 and the conductive layer 228 contacting to each other can be increased, then it is as if charges moving toward the blocking insulation layer 224 from the cell gate electrode 240C are confronted with a high barrier thereby reducing the probability of charges tunneling from the gate electrode to the charge-trapping insulation layer 222.

Metals having a work function larger than about 4 eV include tantalum nitride (TaN), tantalum (Ta), ruthenium (Ru), tungsten silicide (WSi), tungsten (W), tungsten nitride (WN), titanium (Ti), titanium nitride (TiN), tantalum-titanium (TaTi), tantalum-platinum (TaPt), tantalum silicon nitride (TaSiN), tantalum titanium nitride (TaTiN), hafnium nitride (HfN), titanium aluminum nitride (Ti2AlN), molybdenum (Mo) and platinum (Pt). The conductive layer 228 may be formed of a single layer of such a metal, or a metal alloy or stacked layer with two more materials.

A low-voltage gate-insulation layer 214 and a high-voltage gate-insulation layer 216 are formed respectively in the low and high-voltage regions. A low-voltage gate electrode 240L and a high-voltage gate electrode 240H are disposed on the low-voltage gate-insulation layer 214 and the high-voltage gate-insulation layer 216, respectively. Each of the low and high-voltage gate electrodes 240L and 240H includes first, second, and fourth semiconductor layers 217, 218, and 232. The lowest semiconductor layers (e.g., 217) of the low and high-voltage gate electrodes 240L and 240H may be made of polysilicon. The field isolation layers 212 formed in the low and high-voltage regions have sidewalls extending upward from the surface of the substrate 210.

The low and high-voltage gate electrodes, 240L and 240H, may be comprised of portions overlapping with the field isolation layers 212. The first semiconductor layer 217 is formed on the active regions confined by the field isolation layers 212, including sidewalls aligned to the sidewalls of the field isolation layers 212. The second and fourth semiconductor layers, 218 and 232, may have portions overlapping with the field isolation layers 212, making the low and high-voltage gate electrodes 240L and 240H overlap with the field isolation layers 212. A peripheral-circuit gate-silicide layer 238 may be formed on the fourth semiconductor layer 232. Source/drain regions 260 are formed in the substrate 210 at both sides of the low and high-voltage gate electrodes 240L and 240H. The silicide layer 238 also may be formed in the source/drain regions 260.

The silicide layers of the peripheral-circuit gate electrodes and the source/drain regions may be formed by the same processing step and made of a metal silicide containing the same metal. In FIG. 3A, the silicide layer 238 on the cell gate electrode 240L may include a metal different from the silicide layers on the gate electrodes 240L and 240H of the peripheral circuit region and the source/drain regions 260. Sidewall spacers 234 are formed on sidewalls of the gate electrodes (i.e., the low and high-voltage gate electrodes 240L and 240H) in the peripheral circuit region, as well as in the cell region. The silicide layers in the source/drain regions 260 are aligned according to the sidewall spacers 234.

The memory device of FIG. 3A further includes the resistor region where patterns of resistors are arranged. The resistor region is optionally provided for a circuit field where resistors are arranged, which may be a part of the peripheral circuit region. A plurality of resistor patterns 240R are formed in the resistor region. The resistor patterns 240R can be electrically isolated from the semiconductor substrate 210 so as to provide their inherent resistance. Thus, the resistor patterns 240R may be disposed over the field isolation layers that are formed in the semiconductor substrate 210. The resistor pattern 240R may be formed of a stacked structure that includes second and fourth semiconductor layers 218 and 232. In order to offer large resistance per unit area, there is no silicide layer on the fourth semiconductor layer 232 of the resistor pattern 240R.

The low and high-voltage gate electrodes, 240L and 240H, may be gate electrodes of PMOS or NMOS transistors. A dual-polysilicon gate may be used, by which the gate electrodes of the NMOS transistors are doped with N-type impurities while the gate electrodes of the PMOS transistors are doped with P-type impurities. And, the gate electrodes of the transistors and the resistor patterns may be different in doping concentration.

FIGS. 3B through 3D are cross-sectional views showing (in accordance with an example embodiment of the present invention) a method of forming the nonvolatile memory device shown in FIG. 3A.

Referring to FIG. 3B, it defines the cell region, the low-voltage region, the high-voltage region, and the resistor region in the semiconductor substrate 210. The field isolation layers 212 are formed to confine a plurality of active regions in the semiconductor substrate 210. The field isolation layers 212 are formed using self-aligned shallow trench isolation (SASTI).

In detail, the low-voltage gate-insulation layer 214 is formed in the low-voltage region and the cell region while the high-voltage gate-insulation layer 216 is formed in the high-voltage region. The low-voltage gate-insulation layer 214 is thinner than the high-voltage gate-insulation layer 216. The low and high-voltage gate-insulation layers, 214 and 216, may be formed in thickness different from each other, through the processing steps of depositing an insulation layer on the regions of the low and high-voltage gate-insulation layers, removing the insulation layer from the region of the low-voltage gate-insulation layer 214, and re-depositing a new insulation layer on the regions. The first semiconductor layer 217 is deposited on the overall structure of the substrate 210 including the low and high-voltage gate-insulation layers 214 and 216, and the field isolation layers 212 are formed in the semiconductor substrate 210, e.g., by the SASTI technique. As a result, the field isolation layers 212 confine the active regions, and the first semiconductor layer 217 is aligned to sidewalls of the field isolation layers 212 on the active regions.

Thereafter, the second semiconductor layer 218 is deposited on the overall structure of the substrate including the low and high-voltage gate-insulation layers 214 and 216, and then partially removed from the cell region. The second semiconductor layer 218 may be made of polysilicon. During this, the second semiconductor layer 218 is formed, being either undoped or doped by ion implantation during or after deposition of the polysilicon. Further, the second semiconductor layer 218 may be formed also to make the NMOS and PMOS transistors doped with impurities different from each other in conductivity.

Referring to FIG. 3C, the first semiconductor layer 217 and the low-voltage gate-insulation layer 214 are removed from the cell region, exposing the surface of the substrate 210 on the active regions. On the other hand, the surface of the substrate 210 on the active regions may be exposed by way of first removing the first semiconductor layer 217 from the cell region, depositing the second semiconductor layer 218 all over the substrate 210, and removing the second semiconductor layer 218 and the low-voltage gate-insulation layer 214 therefrom.

On the substrate 210, the multi-layer charge-storage insulation layer 226 is formed by depositing the tunnel insulation layer 220, the charge-trapping layer 222, and the blocking insulation layer 224 in sequence. The conductive layer 228 and the third semiconductor layer 230 are deposited on the multi-layer charge-storage insulation layer 226. The conductive layer 228 may be composed of a single layer or multiple layers of metal having a work function larger than about 4 eV. For example, the conductive layer 228 may be formed of a metal such as tantalum nitride (TaN), tantalum (Ta), ruthenium (Ru), tungsten silicide (WSi), tungsten (W), tungsten nitride (WN), titanium (Ti), titanium nitride (TiN), tantalum-titanium (TaTi), tantalum-platinum (TaPt), tantalum silicon nitride (TaSiN), tantalum titanium nitride (TaTiN), hafnium nitride (HfN), titanium aluminum nitride (Ti2AlN), molybdenum (Mo), or platinum (Pt), or otherwise formed of a metal alloy or stacked layer with two more materials.

Removing the third semiconductor layer 330 and the conductive layer 228 from the peripheral circuit region (although not from the cell region), the second semiconductor layer 218 is exposed thereby. The tunnel insulation layer 222 may be restrictively formed on the cell region, e.g., by way of a thermal oxidation process. As a result, the cell region is comprised of a stacked structure with the multi-layer charge-storage insulation layer 226, the conductive layer 228, and the third semiconductor layer 230, while the peripheral circuit region is comprised of the second semiconductor layer 218.

Next, referring to FIG. 3D, the fourth semiconductor layer 232 is deposited on the overall structure of the substrate. The fourth semiconductor layer 232, the third semiconductor layer 230, the second semiconductor layer 218, the first semiconductor layer 217, and the conductive layer 28 are patterned in sequence to form the cell gate electrodes 240C, the low-voltage gate electrode 240L, the high-voltage gate electrode 240H, and the resistor pattern 240R shown in FIG. 3A. The silicide layers 238 disposed on the cell gate electrodes 240C, the low-voltage gate electrode 240L, and the high-voltage gate electrode 240H may be completed through the processing steps of depositing a layer of silicide on the fourth semiconductor layer 232 and then removing the layer of silicide from the resistor region, or completed along with conducting a silicidation process for the source/drain regions 260 after patterning the gate electrodes.

Figure 4A:
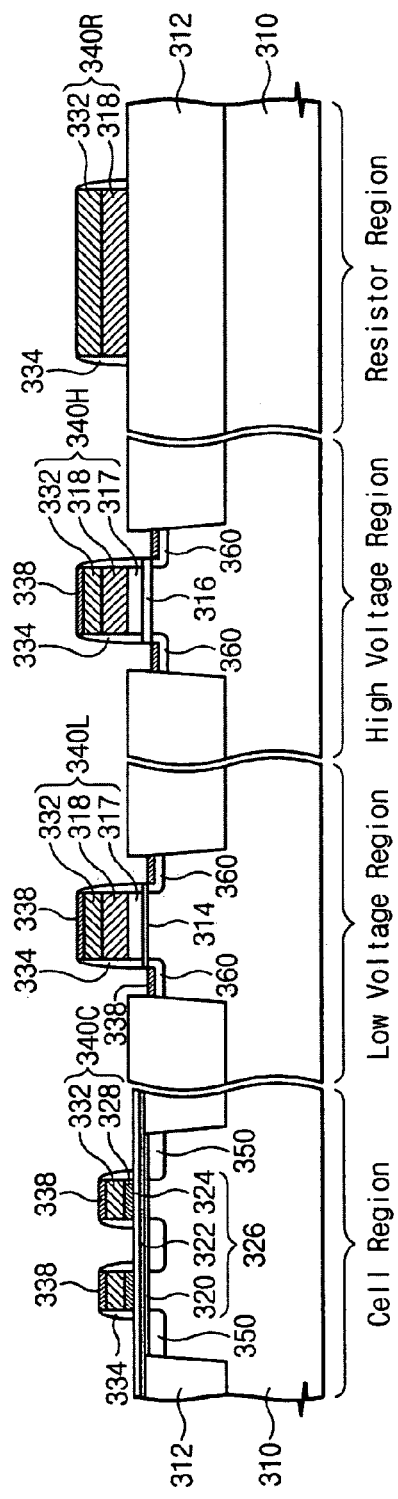
FIG. 4A is a cross-sectional view of a nonvolatile memory device in accordance with an example embodiment of the present invention.

FIG. 4A is a cross-sectional view of a nonvolatile memory device in accordance with an example embodiment of the present invention.

The nonvolatile memory device of FIG. 4A is similar to that according to FIG. 2A, but different in the feature that additional semiconductor layers 317 are further formed, having sidewalls aligned to field isolation layers 312, under the bottoms of low and high-voltage gate electrodes 340L and 340H. In detail, the nonvolatile memory device is comprised of a cell region, a high-voltage region, a low-voltage region, and a resistor region. The cell region includes a multi-layer charge-storage insulation layer 326 on which a cell gate electrode 340C is formed. Source and drain regions 350 are formed in a semiconductor substrate 310 at both sides of the cell gate electrodes 340C. While the multi-layer charge-storage insulation layer 326 is depicted as extending over field isolation layers, it may be confined so as not to extend beyond the cell gate electrodes 340C.

The multi-layer charge-storage insulation layer 326 may be composed of a tunnel insulation layer 320, a charge-trapping insulation layer 322, and a blocking insulation layer 324 those are stacked in sequence. Here, the tunnel insulation layer 320 and the blocking insulation layer 324 may include at least a layer of insulation that is formed of Al2O3, hafnium aluminate (HfAlO), HfAlON, hafnium silicate (HfSiO), or HfSiON. The charge-storage insulation layer 326 may include at least a layer of insulation that is formed of hafnium aluminate, HfAlO, HfAlON, hafnium silicate, HfSiO, or HfSiON.

Also in FIG. 4A, the blocking insulation layer 324 may include at least a layer of insulation having dielectric constant larger than that of the highest-dielectric layer of the tunnel insulation layer 320. The highest-dielectric layer of the blocking insulation layer 324 may be thicker than the highest-dielectric layer of the tunnel insulation layer 320.

The cell gate electrode 340C includes a conductive layer 328, and a third semiconductor layer 332 those are stacked, in order, on the multi-layer charge-storage insulation layer 326. To improve conductivity for the cell gate electrode 340C, a cell-gate silicide layer 338 can be formed on the third semiconductor layer 332. The silicide layer 338 may include a metal layer containing tungsten (W), cobalt (Co), nickel (Ni), and/or titanium (Ti). There may be a stacked layer of tungsten nitride and tungsten layers, instead of the cell-gate silicide layer 338. On the other hand, adequate conductivity of the cell gate electrode 340C is assured by combining the cell-gate silicide layer with the stacked layer of tungsten nitride and tungsten layers.

The conductive layer 328 may be composed of a single layer or multiple layers of metal having a work function larger than about 4 eV in order to elevate the potential barrier between the cell gate electrode 340C and the multi-layer charge-storage insulation layer 326. Metals having a work function larger than about 4 eV include tantalum nitride (TaN), tantalum (Ta), ruthenium (Ru), tungsten silicide (WSi), tungsten (W), tungsten nitride (WN), titanium (Ti), titanium nitride (TiN), tantalum-titanium (TaTi), tantalum-platinum (TaPt), tantalum silicon nitride (TaSiN), tantalum titanium nitride (TaTiN), hafnium nitride (HfN), titanium aluminum nitride (Ti2AlN), molybdenum (Mo) and platinum (Pt). The conductive layer 328 may be formed of a single layer of such a metal, or a metal alloy or stacked layer with two more materials.

A low-voltage gate-insulation layer 314 and a high-voltage gate-insulation layer 316 are formed respectively in the low and high-voltage regions. A low-voltage gate electrode 340L and a high-voltage gate electrode 340H are disposed on the low-voltage gate-insulation layer 314 and the high-voltage gate-insulation layer 316, respectively. Each of the low and high-voltage gate electrodes 340L and 340H includes the first, second, and third semiconductor layers 317, 318 and 332. The field isolation layers 312 formed in the low and high-voltage regions have sidewalls extending upward from the surface of the substrate 310. The low and high-voltage gate electrodes, 340L and 340H, may be comprised of portions overlapping with the field isolation layers 312. The first semiconductor layer 317 is formed on the active regions confined by the field isolation layers 312, including sidewalls aligned to the sidewalls of the field isolation layers 312. The second and third semiconductor layers, 318 and 332, may have portions overlapping with the field isolation layers 312, making the low and high-voltage gate electrodes 340L and 340H overlap with the field isolation layers 312. A peripheral-circuit gate-silicide layer 338 may be formed on the third semiconductor layer 332. The silicide layer 338 may include a metal layer containing tungsten (W), cobalt (Co), nickel (Ni), and/or titanium (Ti). There may be a stacked layer of tungsten nitride and tungsten layers, instead of the cell-gate silicide layer 338. Otherwise, adequate conductivity is assured by combining the cell-gate silicide layer with the stacked layer of tungsten nitride and tungsten layers.

Source/drain regions 360 are formed in the substrate 310 at both sides of the low and high-voltage gate electrodes 340L and 340H. The silicide layer 338 also may be formed in the source/drain regions 360. The silicide layers of the peripheral-circuit gate electrodes and the source/drain regions may be formed by the same processing step and made of a metal silicide containing the same metal.

In FIG. 4A, the silicide layer 338 on the cell gate electrode 340C may include a metal different from the silicide layers on the gate electrodes 340L and 340H of the peripheral circuit region and the source/drain regions 360. This positional differentiation of the silicide layers 338 is because the silicide layer on the gate electrodes is formed by deposition while the silicide layer in the source/drain region 360 may be formed by self-aligned silicidation. In FIG. 4A, the silicide layer of the cell gate electrode 340C may be formed by deposition, while the silicide layers on the peripheral gate electrodes, 340L and 340H, may be formed along with those of the source/drain regions 360 by the self-aligned silicidation.

Sidewall spacers 334 are formed even on sidewalls of the gate electrodes (i.e., the low and high-voltage electrodes 340L and 340H) in the peripheral circuit region, as well as in the cell region. The silicide layers in the source/drain regions 360 are aligned according to the sidewall spacers 334.

The memory device of FIG. 4A further includes the resistor region where patterns of resistors are arranged. The resistor region is optionally provided for a circuit field where resistors are arranged, which may be a part of the peripheral circuit region. A plurality of resistor patterns 340R are formed in the resistor region. The resistor patterns 340R can be electrically isolated from the semiconductor substrate 310 so as to provide their inherent resistance. Thus, the resistor patterns 340R may be disposed over the field isolation layers 312 that are formed in the semiconductor substrate 310. The resistor pattern 340R may be formed of a stacked structure that includes the second and third semiconductor layers 318 and 332. In order to offer large resistance per unit area, there is no silicide layer on the third semiconductor layer 332 of the resistor pattern 340R.

The low and high-voltage gate electrodes, 340L and 340H, may be gate electrodes of PMOS or NMOS transistors. A dual-polysilicon gate may be used, by which the gate electrodes of the NMOS transistors are doped with N-type impurities while the gate electrodes of the PMOS transistors are doped with P-type impurities. And, the gate electrodes of the transistors and the resistor patterns may be different in doping concentration. Also, in FIG. 4A, the lowest semiconductor layers of the low and high-voltage gate electrodes 340L and 340H may be formed of polysilicon, and the conductive layer 328 of the cell gate electrode 340C may further include a polysilicon layer on a single or stacked layer of metal having a work function larger than about 4 eV.

Figure 4B:
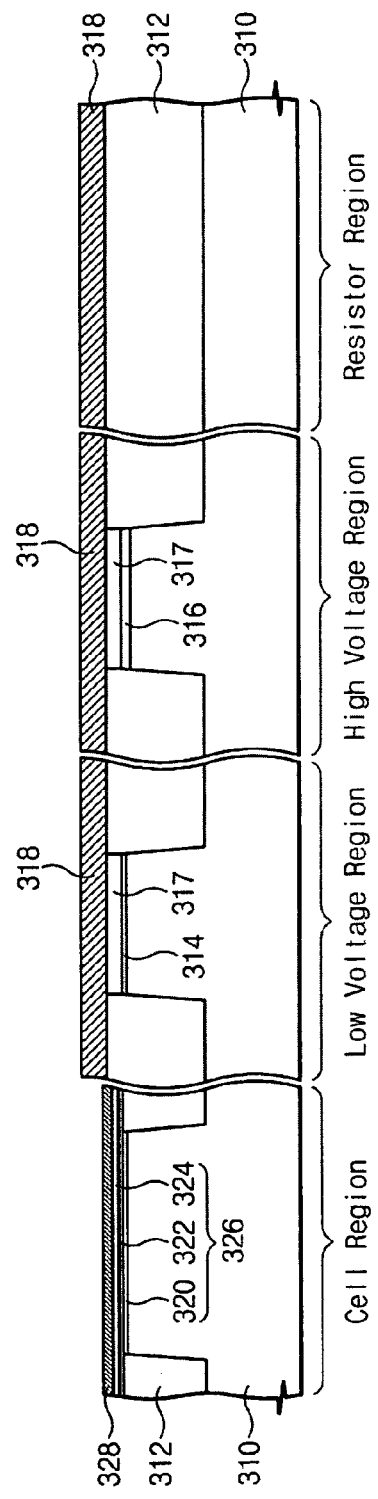
FIGS. 4B and 4C are cross-sectional views showing (in accordance with an example embodiment of the present invention) a method of forming the nonvolatile memory device shown in FIG. 4A.
Figure 4C:
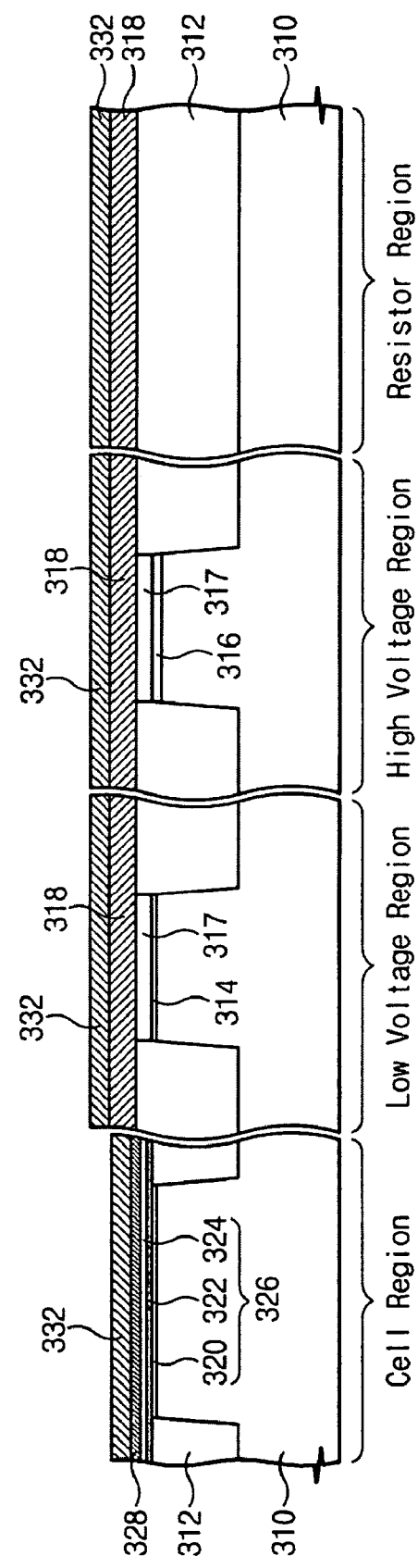

FIGS. 4B and 4C are cross-sectional views showing (in accordance with an example embodiment of the present invention) a method of forming the nonvolatile memory device shown in FIG. 4A.

Referring to FIG. 4B, as with FIG. 3A, after forming the field isolation layers 312 defining the active regions in the substrate 310, and the first semiconductor layer 317, and forming the second semiconductor layer 318 on the overall structure of the substrate 310 including the low and high-voltage gate-insulation layers 314 and 316, the second semiconductor layer 318 is removed from the cell region.

And then, the first semiconductor layer 317 and the low-voltage gate-insulation layer 314 are removed from the cell region, exposing the surface of the substrate 310 on the active regions. On the other hand, the surface of the substrate 310 on the active regions may be exposed by way of first removing the first semiconductor layer 317 from the cell region, depositing the second semiconductor layer 318 all over the substrate 310, and removing the second semiconductor layer 318 and the low-voltage gate-insulation layer 314 therefrom.

On the substrate 310, the multi-layer charge-storage insulation layer 326 is formed by depositing the tunnel insulation layer 320, the charge-trapping layer 322, and the blocking insulation layer 324 in sequence. The conductive layer 328 is deposited on the multi-layer charge-storage insulation layer 326. The conductive layer 328 may be composed of a single layer or multiple layers of metal having a work function larger than about 4 eV. For example, the conductive layer 328 may be formed of a metal such as tantalum nitride (TaN), tantalum (Ta), ruthenium (Ru), tungsten silicide (WSi), tungsten (W), tungsten nitride (WN), titanium (Ti), titanium nitride (TiN), tantalum-titanium (TaTi), tantalum-platinum (TaPt), tantalum silicon nitride (TaSiN), tantalum titanium nitride (TaTiN), hafnium nitride (HfN), titanium aluminum nitride (Ti2AlN), molybdenum (Mo), or platinum (Pt), or otherwise formed of a metal alloy or stacked layer with two more materials.

Removing the conductive layer 328 from the peripheral circuit region (although not from the cell region), the second semiconductor layer 318 is exposed thereby. The tunnel insulation layer 322 may be restrictively formed on the cell region, e.g., by way of a thermal oxidation process. As a result, the cell region is comprised of a stacked structure with the multi-layer charge-storage insulation layer 326 and the conductive layer 328, while the peripheral circuit region is comprised of the second semiconductor layer 318.

Next, referring to FIG. 4C, the third semiconductor layer 332 is deposited on the overall structure of the substrate 310. The third semiconductor layer 332, the second semiconductor layer 318, the first semiconductor layer 317, and the conductive layer 328 are patterned in sequence to form the cell gate electrodes 340C, the low-voltage gate electrode 340L, the high-voltage gate electrode 340H, and the resistor pattern 340R shown in FIG. 4A. The silicide layers 338 disposed on the cell gate electrodes 340C, the low-voltage gate electrode 340L, and the high-voltage gate electrode 340H may be completed through the processing steps of depositing a layer of silicide on the third semiconductor layer 332 and then removing the layer of silicide from the resistor region, or completed along with conducting a silicidation process for the source/drain regions 360 after patterning the gate electrodes. Also, the lowest semiconductor layers of the low and high-voltage gate electrodes 340L and 340H may be formed of polysilicon, and the conductive layer 328 of the cell gate electrode 340C may further include a polysilicon layer on a single or stacked layer of metal having a work function larger than about 4 eV.

In the presently disclosed example embodiments discussed above, the silicide layers in the low and high-voltage regions may be formed, e.g., by way of self-aligned silicidation. During this, the gate electrodes in the low and high-voltage regions may be accompanied with deposition of silicide layers. On the contrary, the silicide layers on the cell gate electrodes are not be formed while processing the self-aligned silicidation for the source/drain regions. And, there is no silicide on the resistor pattern in order to retain high resistance therein.

Figure 5:
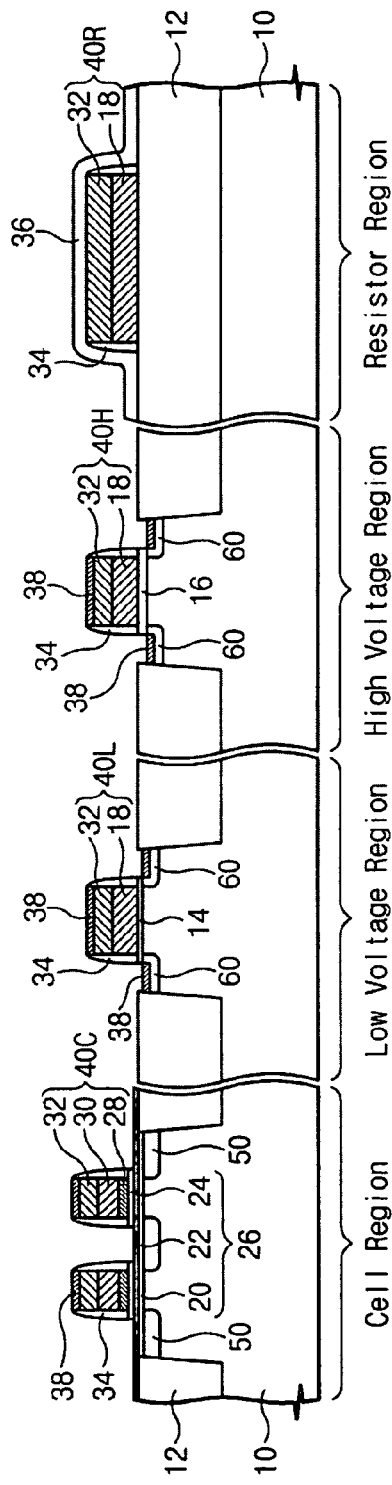
FIGS. 5 and 6 are cross-sectional views showing a silicidation process of a nonvolatile memory device, according to an example embodiment of the present invention.
Figure 6:
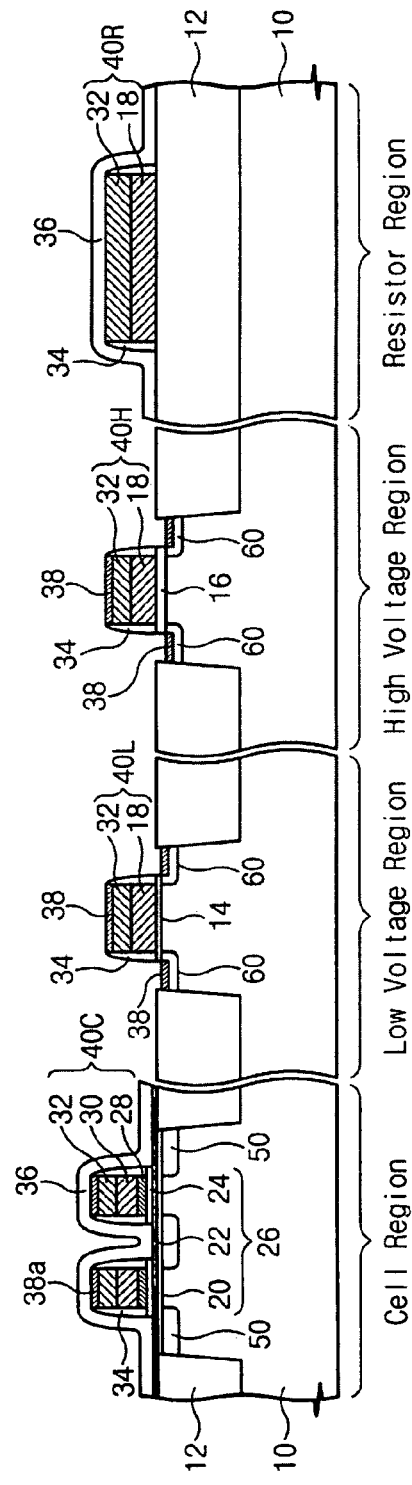

Now, FIGS. 5 and 6 show the processing features of silicidation in a nonvolatile memory device, according to an example embodiment of the present invention.

FIG. 5 illustrates the feature of forming silicide layers on the gate electrodes in the processing step of generating the silicide layers in the source/drain regions of the peripheral-circuit region, relative to FIGS. 1A, 2A and 3A.

Referring to FIG. 5, after patterning the gate electrodes, it forms the source/drain regions, 50 and 60, in the cell and peripheral circuit regions. After forming spacer insulation layers 34, the self-aligned silicidation is carried out to simultaneously form the silicide layers 38 on the cell gate electrodes 40C, the low-voltage hate electrodes 40L, the high-voltage gate electrodes 40H, and the source/drain regions 60. During this, in order to deter (if not prevent) the silicide layer from being formed on the resistor pattern 40R, a silicidation barrier layer (SBL) 36 is deposited to entirely cover the resistor region before conducting the process of silicidation. The SBL 36 may be formed, e.g., of a silicon oxy-nitride layer.

In FIG. 5, while forming the source/drain regions 60, it is available to implant ionic impurities into the semiconductor layers of the low and high-voltage gate electrodes 40L and 40H in the same conductivity with the source/drain regions 60. Thus, as to FIG. 5, a dual gate structure is formed in which gate electrodes of NMOS and PMOS transistors are doped with conductivities different from each other.

There are metals appropriate to the silicidation, such as cobalt (Co), nickel (Ni), titanium (Ti), and so forth. Before conducting the silicidation, the blocking insulation layer 22 included within the charge-storage insulation layer 26 may be partially removed in a cleaning process for eliminating natural oxide layers and particles on the source/drain regions 60.

FIG. 6 illustrates the feature of forming the silicide layers of the low and high-voltage gate electrodes 40L and 40H along with the silicide layers of the source/drain regions 60, completing the silicide layers on the cell gate electrodes 40C before patterning the gate electrodes, relative to FIGS. 1A, 2A, 3A and 4A.

Referring to FIG. 6, and similar to that illustrated in FIG. 1D, the third semiconductor layer 32 is deposited all over the substrate 10 and a silicide layer 38a is formed on the third semiconductor layer 32 in the cell region. In the low and high-voltage regions, the silicide layer is formed and then removed to disclose the third semiconductor layer 32. Even in FIGS. 2A, 3A and 4A as well in FIG. 1A, the silicide layer in the cell region can be removed to expose the semiconductor layer in the peripheral circuit region.

Continuously, a patterning process for gate electrodes is carried out to form the cell gate electrodes 40C, the low and high-voltage gate electrodes 40L and 40H, and the resistor pattern 40R. Here, the cell gate electrodes 40C each include the silicide layers 38a, while the low and high-voltage gate electrodes 40L and 40H and the resistor pattern 40R expose the semiconductor layer 32 thereon. Thereafter, the source/drain regions, 50 and 60, are formed in the cell and peripheral circuit regions, respectively. And, the spacer insulation layers 34 are located all over the cell, peripheral circuit, and resistor regions.

In FIG. 6, while the cell gate electrodes 40C are comprised of the silicide layers 38a, the low and high-voltage gate electrodes 40L and 40H are still not accompanied with silicide layers. In order to provide the silicide layers for the low and high-voltage gate electrodes 40L and 40H and the source/drain regions 60, the SBL 36 is formed to cover the cell and resistor regions. The SBL 36 may be formed, e.g., of a silicon oxy-nitride layer.

The self-aligned silicidation is carried out to form the silicide layers 38 on the exposed semiconductor layers of the low and high-voltage gate electrodes 40L and 40H, and the source/drain regions 60. The silicide layer may be formed of cobalt (Co), nickel (Ni), titanium (Ti), and so forth. In the presently disclosed example embodiments, a cleaning process may be conducted prior to the silicidation and the blocking insulation layer 22 may be partially removed from the cell region, in order to reduce (if not eliminate) natural oxide layers and particles from the regions to be formed with the silicide layers. Also, while forming the source/drain regions 60, it is available to implant ionic impurities into the semiconductor layers of the low and high-voltage gate electrodes 40L and 40H in the same conductivity with the source/drain regions 60.

Figure 7:
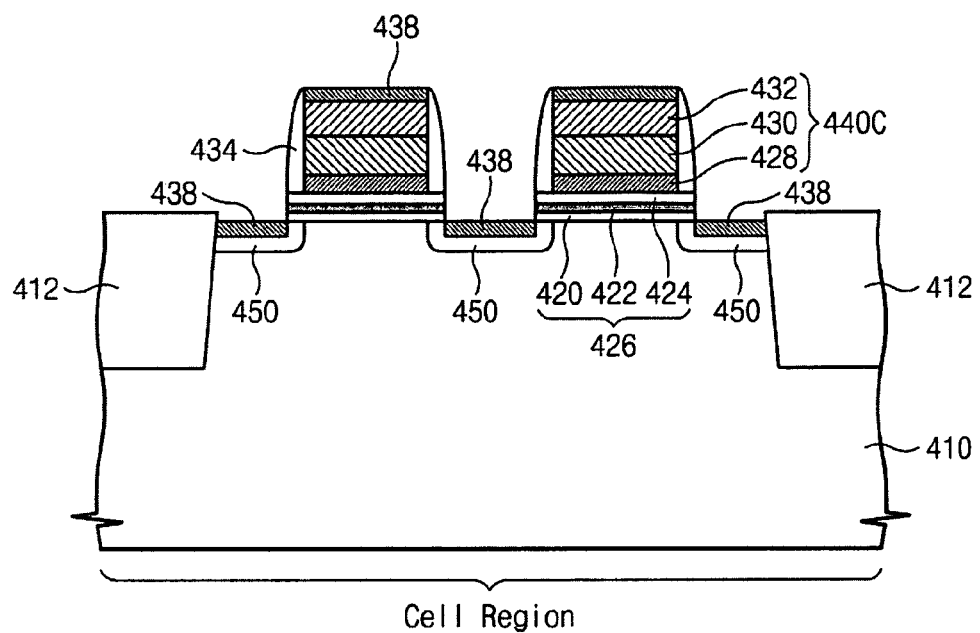
FIGS. 7 and 8 are cross-sectional views showing a silicidation process of a cell region of a nonvolatile memory device, according to example embodiments of the present invention. respectively.
Figure 8:
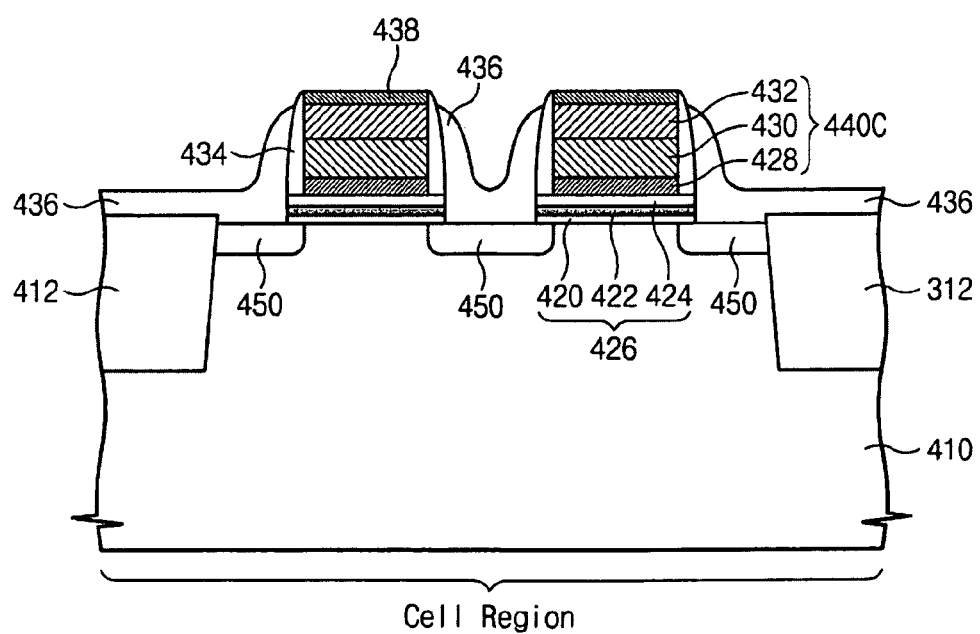

FIGS. 7 and 8 are cross-sectional views showing a silicidation process of the cell region of a nonvolatile memory device in accordance with an example embodiment of the present invention.

Referring to FIG. 7, relative to FIGS. 1A, 2A, 3A and 4A, silicide layers 438 can be formed on source/drain regions 450 and cell gate electrodes 440C in the cell region. The silicide layers 438 are completed, after forming spacer insulation layers 434 on sidewalls of the cell gate electrodes 440C, through the processing steps of patterning multi-layer charge-storage insulation layers 426 to make the cell gate electrodes 440C to be aligned with the space insulation layers 434, and conducting the self-aligned silicidation. As a result, the silicide layers 38 are located on the cell gate electrodes 440C and the source/drain regions 450. It can be understood that the stacked structure of the cell gate electrode 440C is variable by the features of FIGS. 1A, 2A, 3A and 4A.

According to FIG. 7, the multi-layer charge-storage insulation layers 426 under the cell gate electrodes 440C are configured to have sidewalls aligned to the sidewalls of the spacer insulation layers 434. Thus, as the faces to be etched away from the multi-layer charge-storage insulation layers 426 deviate from the boundaries of the channel regions, it is possible to provide a structure capable of restraining data failure due to etch damages.

FIG. 8 shows (in accordance with an example embodiment of the present invention) the structural feature that the multi-layer charge-storage insulation layers 426 have the sidewalls aligned to the sidewalls of the spacer insulation layers 434 but without the silicide layers in the source/drain regions 450. This structure is advantageous to restraining generation of leakage currents due to the silicide layers, reducing data failure due to etch damages. In order not to generate the silicide layers on the source/drain regions 450 but to form the silicide layers on the cell gate electrodes 440C, the process of silicidation is carried out while the source/drain regions 450 are covered by the SBL 436. As a result, the silicide layers 438 are only arranged on the cell gate electrodes 440C.

Figure 9:
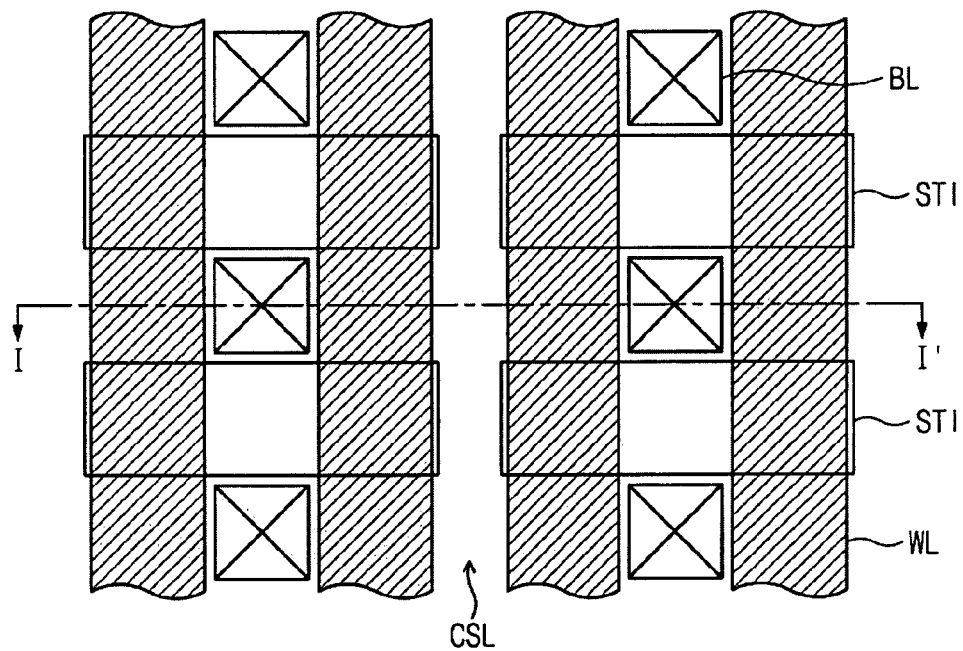
FIG. 9 is a plan view of a NOR-type nonvolatile memory device in accordance with an example embodiment of the present invention.
Figure 10:
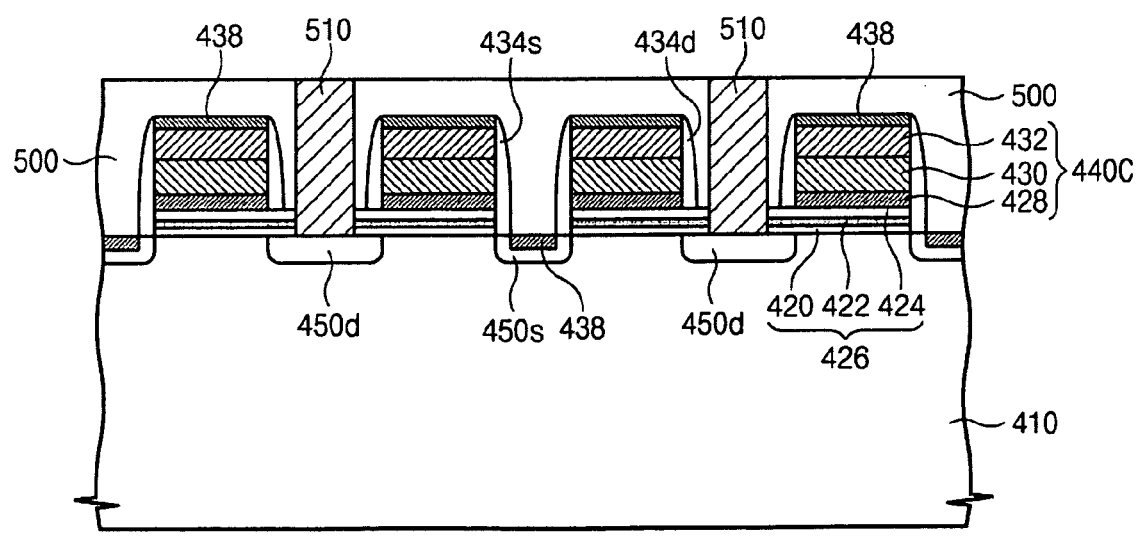
FIG. 10 is a cross-sectional view of the NOR-type nonvolatile memory device of FIG. 9 in accordance with an example embodiment of the present invention.

FIG. 9 is a plan view of a NOR-type nonvolatile memory device in accordance with an example embodiment of the present invention. FIG. 10 is a cross-sectional view of NOR-type nonvolatile memory device of FIG. 9 in accordance with an example embodiment of the present invention.

The NOR-type nonvolatile memory device of FIGS. 9-10 can be fabricated according to, e.g., the example embodiments of FIGS. 1 through 8. As illustrated, the NOR-type nonvolatile memory device is configured with including wordlines (WL) 440C crossing over the active regions confined by the field isolation layers STI, drain regions 450d disposed in the active regions between wordlines, and common source lines CSL arranged in the active regions between wordlines. The common source line CSL is connected to source regions 450S. Bitline contacts (BC) 510 are electrically connected to the drain regions 450d, penetrating an interlevel insulation layer 500.

In fabricating the NOR-type nonvolatile memory device, the field isolation layers STI are partially removed for the purpose of forming the common source lines CSL. During this process, the multi-layer charge-storage insulation layers 426 are partially removed on the common source lines CSL. Therefore, the multi-layer charge-storage insulation layer 426 are configured to have sidewalls aligned with sidewalls of the cell gate electrodes, i.e., the wordlines (WL) 440C, along the source regions 450S, and extend to the drain regions 450d.

The spacer insulation layers 434d at the sides of the drain regions are disposed on the multi-layer charge-storage insulation layers 426, while the spacer insulation layers 434s at the sides of the source regions contact with the sidewalls of the multi-layer charge-storage insulation layers 426. After completing the structure of the spacer insulation layers 434s and 434d, the silicide layers are formed on the cell gate electrodes 440C and the exposed common source lines CSL. As the silicide layers 438 are located on the common source lines CSL, it is able to reduce the resistance of the common source lines CSL.

Figure 11:
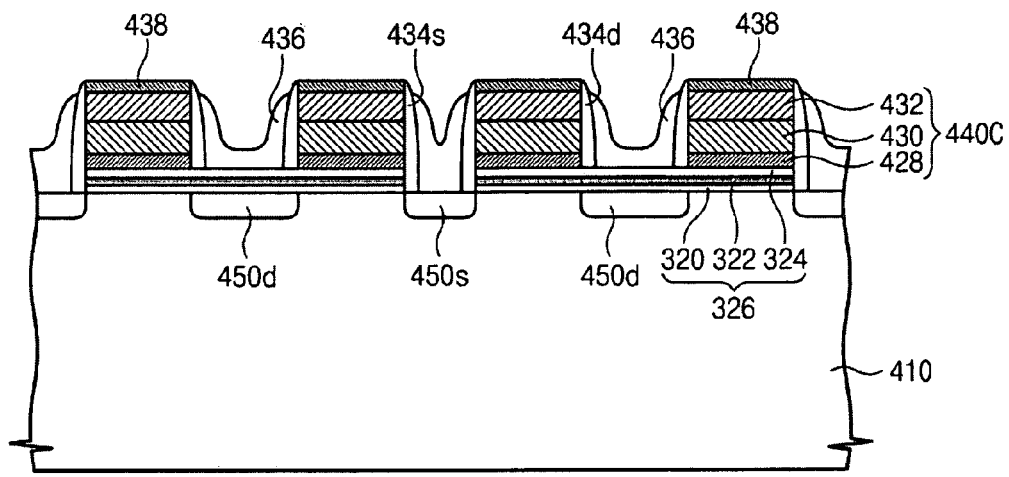
FIGS. 11 and 12 are cross-sectional views showing a part of a process of forming a NOR-type nonvolatile memory device in accordance with an example embodiment of the present invention.
Figure 12:
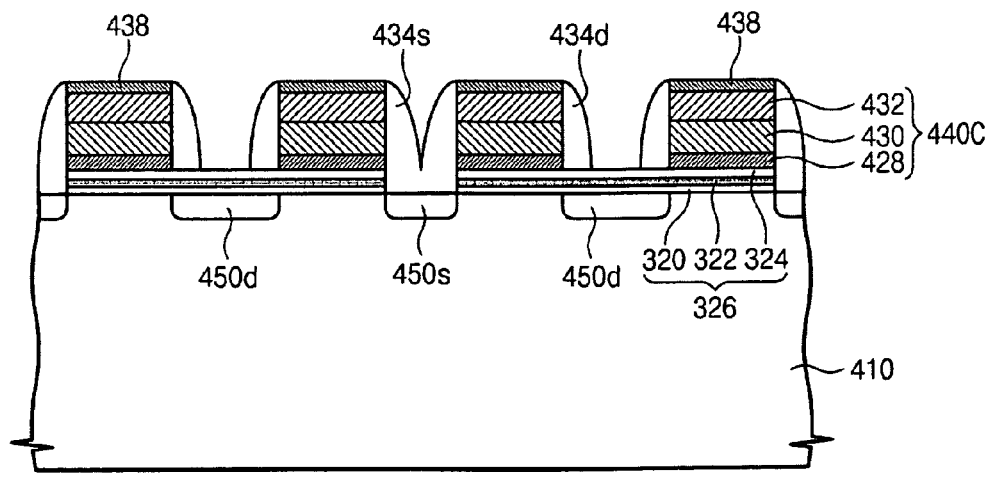

FIGS. 11 and 12 are cross-sectional views showing a part of a process of forming a NOR-type nonvolatile memory device in accordance with an example embodiment of the present invention.

Referring to FIG. 11, in order to deter (if not prevent) the silicide layers from being formed both on the source and drain regions 450s and 450d, the SBL 436 may be formed to cover the source regions 450s before the process of self-aligned silicidation. Conducting the process of silicidation after depositing the SBL 436, the silicide layers may be arranged on the gate electrodes 440C but not on the source and drain regions 450s and 450d.

Referring to FIG. 12, silicidation of the source regions 450s can be deterred (if not prevented) by using the spacer insulation layers 434s formed on the sidewalls of the gate electrodes 440C, without having to use the SBL 436. Typically, the drain regions 450d are designed to be wider for the bitline contacts, but the source regions 450s are designed to be narrower. With this dimensional condition of the narrower source regions, the spacer insulation layers 434s being opposite to each other on the source regions 450s meet with each other while being formed on the sidewalls of the cell gate electrodes 440C, resultantly covering the source regions 450s by the spacer insulation layers 434s. On the other hand, even though the spacer insulation layers 434d on the drain regions 450d do not contact with each other, the silicide layers are deterred (if not prevented) from being formed on the drain regions 450d because there are no generation of the multi-layer charge-storage insulation layers 326.

Figure 13:
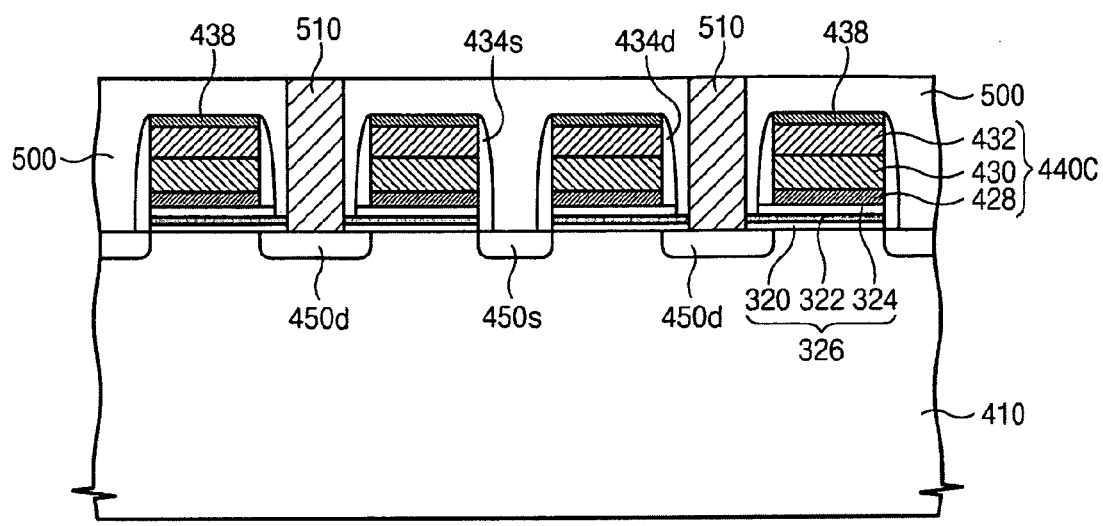
FIG. 13 is a cross-sectional view of a NOR nonvolatile memory device in accordance with an example embodiment of the present invention.

FIG. 13 is a cross-sectional view of a NOR nonvolatile memory device in accordance with an example embodiment of the present invention. As illustrated in FIG. 13, the silicide layers 438 are disposed on the gate electrodes 440C but not in the source and drain regions 450s and 450d. The multi-layer charge-storage insulation layers 326 are configured to have sidewalls aligned with sidewalls of the cell gate electrodes 440C, along the source regions 450S, and extend to the drain regions 450d. The blocking insulation layers 324 of the multi-layer charge-storage insulation layers 326 have sidewalls aligned to the sidewalls of the spacer insulation layers 434d, along the drain regions 450d. This feature results from the fact that the blocking insulation layers 324 are partially removed when natural oxide layers and particles are being eliminated to form silicide layers on the source/drain regions of the peripheral circuit region.

According to one or more embodiments of the present invention, it is able to form the cell gate electrodes contacting with the multi-layer charge-storage insulation layers, and the peripheral-circuit gate electrodes contacting with the gate insulation layers in individual processing steps. This makes it possible for the cell gate electrodes and the peripheral-circuit gate electrodes to be made of materials different from each other. Hence, it is effectively available to provide the structure of cell gate electrodes suitable for maintaining the efficiencies of writing and erasing data with memory cells and the retention of data. Moreover, it is possible to form peripheral-circuit gate electrodes of a material proper to improving the characteristics of peripheral-circuit transistors without affecting the performance of the memory cells.

While there has been illustrated and described what are presently considered to be example embodiments of the present invention, it will be understood by those skilled in the art that various other modifications may be made, and equivalents may be substituted, without departing from the true scope of the invention. Additionally, many modifications may be made to adapt a particular situation to the teachings of the present invention without departing from the central inventive concept described herein. Therefore, it is intended that the present invention not be limited to the particular example embodiments that are presently disclosed, but that the invention include all embodiments falling within the scope of the appended claims.

What is claimed is:

1. A nonvolatile memory device comprising:
a substrate having cell and peripheral circuit regions;
a multi-layer charge-storage insulation layer physically formed on the substrate in the cell region;
a cell gate electrode having a lower cell conductive layer and at least one upper cell conductive layer stacked on the multi-layer charge-storage insulation layer;
a gate insulation layer formed on the substrate in the peripheral circuit region; and
a peripheral-circuit gate electrode having peripheral conductive layers stacked on the gate insulation layer,
wherein the lower cell conductive layer is different from the lowest one of the peripheral conductive layers of the peripheral-circuit gate electrode, and
wherein the lower cell conductive layer is a single layer or a multiple layer of a metal having a work function larger than about 4 eV and physically contacts the multi-layer charge-storage insulation layer.

2. The nonvolatile memory device as set forth in claim 1, wherein the lower cell conductive layer further comprises a polysilicon layer formed on the single layer or the multiple layer of the metal.

3. The nonvolatile memory device as set forth in claim 1, wherein the lower cell conductive layer is made of at least one selected from the group consisting of tantalum nitride (TaN), tantalum (Ta), ruthenium (Ru), tungsten silicide (Wsi), tungsten (W), tungsten nitride (WN), titanium (Ti), titanium nitride (TiN), tantalum-titanium (TaTi), tantalum-platinum (TaPt), tantalum silicon nitride (TaSiN), tantalum titanium nitride (TaTiN), hafnium nitride (HfN), titanium aluminum nitride ($Ti_2AlN$), molybdenum (Mo) and platinum (Pt).

4. The nonvolatile memory device as set forth in claim 1, wherein the lowest one of the peripheral conductive layers is a polysilicon layer.

5. The nonvolatile memory device as set forth in claim 1, wherein the highest one of the upper cell conductive layers of the cell gate electrode is the same as the highest one of the peripheral conductive layers of the peripheral-circuit gate electrode.

6. The nonvolatile memory device as set forth in claim 1, wherein the cell gate electrode further comprises a cell silicide layer formed on the at least one upper cell conductive layer, and the peripheral-circuit gate electrode further comprises a peripheral silicide layer formed on the peripheral conductive layers.

7. The nonvolatile memory device as set forth in claim 6, wherein the cell silicide layer is a metal silicide layer and the peripheral silicide layer is another metal silicide layer.

8. The nonvolatile memory device as set forth in claim 7, further comprising:
source/drain regions formed in the substrate at both sides of the peripheral-circuit gate electrode; and
a substrate silicide layer formed on the source/drain regions,
wherein the peripheral silicide layer and the substrate silicide layer are the same metal silicide layers.

9. The nonvolatile memory device as set forth in claim 1, further comprising:
a field isolation layer confining a plurality of active regions in the substrate,
wherein the cell gate electrode and the peripheral-circuit gate electrode cross over the active regions, and the lowest one of the peripheral conductive layers has sidewalls aligned to the field isolation layer.

10. The nonvolatile memory device as set forth in claim 1, further comprising:
a resistor region defined in the substrate; and
a resistor pattern formed in the resistor region,
wherein the resistor pattern is configured in the same stacked structure as the peripheral conductive layers of the peripheral-circuit gate electrode.

11. The nonvolatile memory device as set forth in claim 10, wherein the cell gate electrode further comprises:
a cell silicide layer formed on the at least one cell upper conductive layer, and the peripheral-circuit gate electrode further comprises a peripheral silicide layer formed on the peripheral conductive layers.

12. The nonvolatile memory device as set forth in claim 1, further comprising:
a source region and a drain region formed in the substrate at both sides of the cell gate electrode, respectively; and
spacer insulation layers formed on sidewalls of the cell gate electrode,
wherein the multi-layer charge-storage insulation layer is aligned under the cell gate electrode and the spacer insulation layers.

13. The nonvolatile memory device as set forth in claim 1, wherein the cell gate electrode includes a first sidewall and a second sidewall opposite to the first sidewall, and the device further comprises:
a source region formed in the substrate to be adjacent to the first sidewall of the cell gate electrode;
a drain region formed in the substrate to be adjacent to the second sidewall of the cell gate electrode; and
spacer insulation layers formed on the first sidewall and the second sidewall of the cell gate electrode,
wherein the multi-layer charge-storage insulation layer extends to the drain region, a sidewall of the multi-layer charge-storage insulation layer being aligned to the first sidewall of the cell gate electrode adjacent to the source region.

14. The nonvolatile memory device as set forth in claim 1, wherein the multi-layer charge-storage insulation layer includes a tunnel insulation layer, a charge-trapping insulation layer, and a blocking insulation layer which are stacked.

15. The nonvolatile memory device as set forth in claim 14, further comprising:
a source region and a drain region formed in the substrate at both sides of the cell gate electrodes; and
spacer insulation layers formed on sidewalls of the cell gate electrode,
wherein the blocking insulation layer is aligned under the cell gate electrode and the spacer insulation layers, and
wherein the tunnel and charge-trapping insulation layers extend to the source and drain regions.

16. The nonvolatile memory device as set forth in claim 14, further comprising:
a source region and a drain region formed in the substrate at both sides of the cell gate electrodes, respectively; and
spacer insulation layers formed on sidewalls of the cell gate electrode,
wherein the blocking insulation layer is aligned under the cell gate electrode and the spacer insulation layers, and
wherein the tunnel and charge-trapping insulation layers extend to the drain region, a sidewall of the tunnel and charge-trapping insulation layers being aligned to the sidewall of the cell gate electrode at a side of the source region.

17. A nonvolatile memory device comprising:
a semiconductor substrate having cell and peripheral circuit regions;
field isolation layers formed in the semiconductor substrate to define a plurality of active regions in the cell and peripheral circuit regions;
multi-layer charge-storage insulation layers physically formed on the semiconductor substrate of the cell region;
a plurality of cell gate lines arranged on the multi-layer charge-storage insulation layers, crossing over the semiconductor substrate of the cell region and having a lower cell conductive layer and an upper cell conductive layer;
a common source line formed in the semiconductor substrate to be parallel with the cell gate lines and to be adjacent to a first sidewall of one cell gate line selected from the cell gate lines;
a drain region formed in the semiconductor substrate to be adjacent to a second sidewall of the one cell gate line selected from the cell gate lines and to be apart from the common source line;
a gate insulation layer formed on the semiconductor substrate of the peripheral circuit region;
a peripheral-circuit gate electrode having peripheral conductive layers on the gate insulation layer; and
sidewall spacers formed on both sidewalls of the cell gate lines and the peripheral-circuit gate electrode,
wherein the lowest one of the peripheral conductive layers of the peripheral-circuit gate electrode is different from the lower cell conductive layer, and
wherein the lower cell conductive layer is a single layer or a multiple layer of a metal having a work function larger than about 4 eV physically and contacts the multi-layer charge-storage insulation layer.

18. The nonvolatile memory device as set forth in claim 17, wherein the multi-layer charge-storage insulation layers extend to the common source line and the drain region.

19. The nonvolatile memory device as set forth in claim 17, wherein the multi-layer charge-storage insulation layer is aligned under the cell gate lines and the spacers.

20. The nonvolatile memory device as set forth in claim 17, wherein the multi-layer charge-storage insulation layers extend to the drain region and have sidewalls aligned to the first sidewall of the one cell gate line selected from the cell gate lines.

21. The nonvolatile memory device as set forth in claim 17, wherein the common source line is disposed between two neighboring cell gate lines, and the sidewall spacers on opposing sidewalls of the two neighboring cell gate lines are connected with each other to cover the common source line.

* * * * *